(12) United States Patent
An et al.

(10) Patent No.: US 11,557,740 B2
(45) Date of Patent: Jan. 17, 2023

(54) DISPLAY DEVICE INCLUDING ADHESIVE LAYER HAVING MULTIPLE ADHESIVE LAYERS

(71) Applicant: Samsung Display Co., LTD., Yongin-si (KR)

(72) Inventors: Cheolgeun An, Yongin-si (KR); Kyoungah Lee, Seoul (KR); Euiyun Jang, Seoul (KR); Seul-Gi Kim, Seoul (KR); Yejin Kim, Seoul (KR); Wonjoon Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 130 days.

(21) Appl. No.: 17/088,027

(22) Filed: Nov. 3, 2020

(65) Prior Publication Data

US 2021/0249614 A1  Aug. 12, 2021

(30) Foreign Application Priority Data

Feb. 7, 2020  (KR) .......................... 10-2020-0014590

(51) Int. Cl.
*H01L 51/00* (2006.01)
*H01L 51/50* (2006.01)
(Continued)

(52) U.S. Cl.
CPC ........ *H01L 51/0097* (2013.01); *H01L 27/323* (2013.01); *H01L 27/3244* (2013.01);
(Continued)

(58) Field of Classification Search
CPC ............... H01L 51/0097; H01L 51/524; H01L 51/5246; H01L 51/5072; H01L 51/5056;
(Continued)

(56) References Cited

U.S. PATENT DOCUMENTS 9,051,493 B2  6/2015  Bower et al.
10,367,173 B1 * 7/2019  Wu ....................... H01L 51/502
(Continued)

FOREIGN PATENT DOCUMENTS

KR  10-2017-0024200  3/2017
KR  10-2017-0072973  6/2017
(Continued)

*Primary Examiner* — Ida M Soward
(74) *Attorney, Agent, or Firm* — Kile Park Reed & Houtteman PLLC

(57) ABSTRACT

A display device includes a display part including a first non-folding area, a second non-folding area, and a folding area between the first non-folding area and the second non-folding area, the folding area being foldable with respect to a folding axis, a window disposed on the display part, and an adhesive layer disposed between the display part and the window, the adhesive layer including a first adhesive material and a second adhesive material having an elongation rate greater than an elongation rate of the first adhesive material. The first adhesive material has a planar area greater than a planar area of the second adhesive material in each of the first non-folding area and the second non-folding area, and the second adhesive material has a planar area greater than a planar area of the first adhesive material in the folding area.

20 Claims, 17 Drawing Sheets

(51) Int. Cl.
*H01L 51/52* (2006.01)
*H01L 27/32* (2006.01)
*G02F 1/1333* (2006.01)
*G06F 1/16* (2006.01)
*H01L 27/146* (2006.01)

(52) U.S. Cl.
CPC ...... *H01L 51/524* (2013.01); *G02F 1/133305* (2013.01); *G02F 1/133331* (2021.01); *G06F 1/1641* (2013.01); *H01L 27/14678* (2013.01); *H01L 27/3246* (2013.01); *H01L 51/5056* (2013.01); *H01L 51/5072* (2013.01); *H01L 51/5088* (2013.01); *H01L 51/5092* (2013.01); *H01L 2251/301* (2013.01); *H01L 2251/5338* (2013.01)

(58) Field of Classification Search
CPC ............. H01L 51/5088; H01L 51/5092; H01L 27/323; H01L 27/3244; H01L 27/3246; H01L 27/3295; H01L 27/14678; H01L 2251/5338; H01L 2251/301; G02F 1/133305; G02F 1/133331; G06G 1/1652; G06G 1/1641; G06G 2203/04102; G09G 9/301

See application file for complete search history.

(56) References Cited

U.S. PATENT DOCUMENTS

| | | | |
|---|---|---|---|
| 10,559,779 | B2 | 2/2020 | Kim |
| 10,645,801 | B2 | 5/2020 | Han |
| 11,412,625 | B2* | 8/2022 | Kim ...................... G06F 1/1652 |
| 2015/0131237 | A1* | 5/2015 | Chen ................... H01L 51/0097 361/728 |
| 2016/0338219 | A1* | 11/2016 | Seo ....................... G06F 1/1652 |
| 2017/0066221 | A1* | 3/2017 | Lee ....................... G06F 1/1652 |
| 2017/0293194 | A1* | 10/2017 | Hou ...................... H01L 51/0097 |
| 2017/0352692 | A1* | 12/2017 | Lee ....................... H01L 51/5253 |
| 2019/0061318 | A1 | 2/2019 | Jung et al. |
| 2020/0037442 | A1* | 1/2020 | Keum ................. H01L 27/3276 |
| 2020/0209998 | A1* | 7/2020 | Shin ....................... G06F 1/1643 |
| 2022/0135728 | A1* | 5/2022 | Lee ....................... C09J 133/08 428/344 |

FOREIGN PATENT DOCUMENTS

| | | |
|---|---|---|
| KR | 10-2017-0093610 | 8/2017 |
| KR | 10-2019-0074820 | 6/2019 |

\* cited by examiner

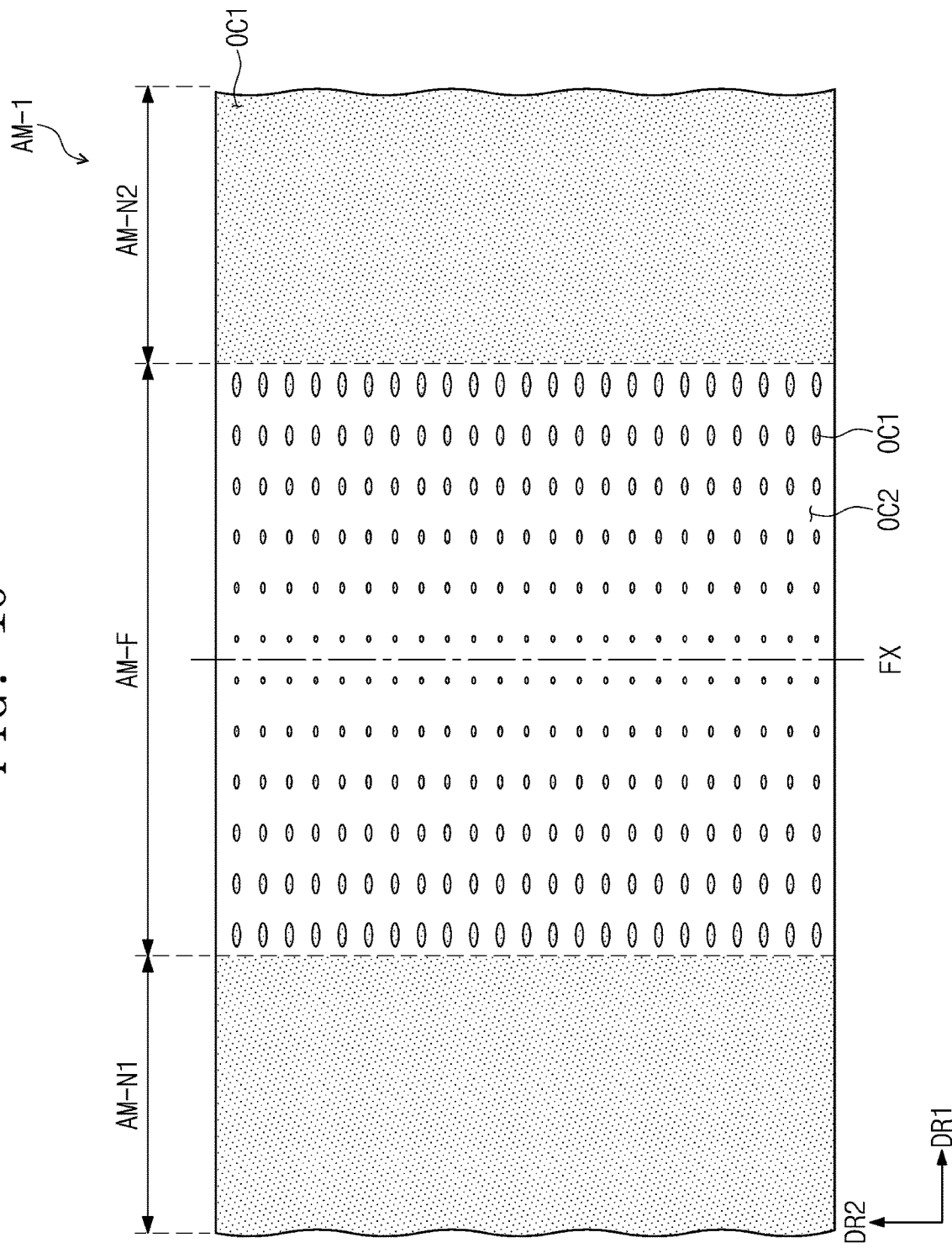

DISPLAY DEVICE INCLUDING ADHESIVE LAYER HAVING MULTIPLE ADHESIVE LAYERS

CROSS-REFERENCE TO RELATED APPLICATION(S)

This application claims priority to and benefits of Korean Patent Application No. 10-2020-0014590, filed in the Korean Intellectual Property Office on Feb. 7, 2020, the entire contents of which are incorporated herein by reference.

BACKGROUND

1. Technical Field

The disclosure relates to a foldable display device.

2. Description of the Related Art

Various display devices used for multimedia devices such as televisions, mobile phones, tablet computers, navigation units, and game consoles have been developed. The display devices may include a keyboard or a mouse as an input device. In recent years, the display devices may include an input sensing layer as the input device.

Various types of display devices have been recently developed in addition to a flat display device. For example, various flexible display devices have been developed, such as a curved display device, a bendable display device, a foldable display device, a rollable display device, and a stretchable display device. Particularly, a foldable display device capable of being folded with respect to a folding axis has been developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device that may include different kinds of adhesive members in a folding area.

An embodiment of the inventive concept provides a display device that may include a display part comprising a first non-folding area, a second non-folding area, and a folding area between the first non-folding area and the second non-folding area, the folding area being foldable with respect to a folding axis, a window disposed on the display part, and an adhesive layer disposed between the display part and the window, the adhesive layer including a first adhesive material, and a second adhesive material having an elongation rate greater than an elongation rate of the first adhesive material. The first adhesive material may have a planar area greater than a planar area of the second adhesive material in each of the first non-folding area and the second non-folding area, and the second adhesive material may have a planar area greater than a planar area of the first adhesive material in the folding area.

In an embodiment, a portion of the first adhesive material may overlap the folding area and may include a shape of adhesive patterns arranged in a first direction and extending in a second direction perpendicular to the first direction, and each of the adhesive patterns may include adhesive parts arranged with a distance between the adhesive parts in the second direction.

In an embodiment, a portion of the second adhesive material may overlap the folding area and may surround the adhesive patterns on a plane.

In an embodiment, the folding area may include a first area and a second area, which may be divided with respect to the folding axis, the adhesive patterns may include first adhesive patterns that overlap the first area and second adhesive patterns that overlap the second area, a distance between first adhesive parts contained in the first adhesive patterns in the first direction among the adhesive parts may increase in a direction toward the folding axis, and a distance between second adhesive parts contained in the second adhesive patterns in the first direction among the adhesive parts may increase in the direction toward the folding axis.

In an embodiment, the first area may be between the first non-folding area and the second area, and the second area may be between the second non-folding area and the first area.

In an embodiment, the adhesive patterns may include a first adhesive pattern and a second adhesive pattern disposed closer to the folding axis than the first adhesive pattern, and each of adhesive parts of the first adhesive pattern may have an area greater than an area of each of adhesive parts of the second adhesive pattern on a plane.

In an embodiment, the adhesive parts of the first adhesive pattern may have areas that are same as each other, and the adhesive parts of the second adhesive pattern may have areas that are same as each other on the plane.

In an embodiment, at least a portion of the first adhesive material may not overlap the second adhesive material in the folding area.

In an embodiment, the second adhesive material may cover an entirety of the adhesive patterns.

In an embodiment, the second adhesive material that overlaps the first non-folding area may have a shape of first sub-adhesive patterns arranged in the first direction and extending in the second direction, and each of the first sub-adhesive patterns may include first sub-adhesive parts arranged with a distance between first sub-adhesive parts in the second direction.

In an embodiment, the first adhesive material that overlaps the first non-folding area may surround the first sub-adhesive patterns on a plane.

In an embodiment, a distance between the first sub-adhesive parts that overlap the first non-folding area may decrease in a direction toward the folding area in the first direction.

In an embodiment, the first sub-adhesive patterns may include a first pattern and a second pattern disposed closer to the folding area than the first pattern, and each of the first sub-adhesive parts of the second pattern may have an area greater than an area of each of the first sub-adhesive parts of the first pattern on a plane.

In an embodiment, the second adhesive material that overlaps the second non-folding area may have a shape of second sub-adhesive patterns arranged in the first direction and extending in the second direction, each of the second sub-adhesive patterns may include second sub-adhesive parts arranged with a distance between the second sub-adhesive parts in the second direction, and the first adhesive material that overlaps the second non-folding area may surround the second sub-adhesive patterns on a plane.

In an embodiment, the first non-folding area may include a first sub-area, and a second sub-area that overlaps the first sub-adhesive patterns and is between the first sub-area and the folding area, and the first sub-area may have an area greater than an area of the second sub-area on a plane.

In an embodiment of the inventive concept, a display device may include a display part including a first non-folding area, a second non-folding area, and a folding area disposed between the first non-folding area and the second non-folding area, the folding area being foldable with respect to a folding axis, a window disposed on the display part, and an adhesive layer disposed between the display part and the window, the adhesive layer including a first adhesive material and a second adhesive material having an elongation rate greater than an elongation rate of the first adhesive material. A portion of the first adhesive material that overlaps the folding area may have a shape of adhesive patterns arranged in a first direction and extending in a second direction perpendicular to the first direction, and a distance between two neighboring adhesive patterns of the adhesive patterns increases in a direction toward the folding axis in the first direction.

In an embodiment, each of the adhesive patterns may include adhesive parts arranged with a distance between the adhesive parts in the second direction, the two adhesive patterns may be a first adhesive pattern and a second adhesive disposed closer to the folding axis than the first adhesive pattern, and each of adhesive parts of the first adhesive pattern may have an area greater than an area of each of adhesive parts of the second adhesive pattern on a plane.

In an embodiment, the second adhesive material may not overlap each of the first non-folding area and the second non-folding area.

In an embodiment of the inventive concept, a display device may include a display part including a first non-folding area, a second non-folding area, and a folding area between the first non-folding area and the second non-folding area, the folding area being foldable with respect to a folding axis, a window disposed on the display part, and an adhesive layer disposed between the display part and the window, the adhesive layer including a first adhesive material and a second adhesive material having an elongation rate greater than an elongation rate of the first adhesive material. The adhesive layer that overlaps the folding area may include a first adhesive layer disposed on the display part and corresponding to the first adhesive material, a second adhesive layer disposed on the first adhesive layer and corresponding to the first adhesive material, and a third adhesive layer disposed between the first adhesive layer and the second adhesive layer and corresponding to the second adhesive material.

In an embodiment, the third adhesive layer may have a thickness greater than a sum of a thickness of the first adhesive layer and a thickness of the second adhesive layer in a thickness direction of the display part.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 10 is a schematic plan view illustrating an adhesive layer according to another embodiment of the inventive concept;

DETAILED DESCRIPTION OF THE EMBODIMENTS

Figure 1:
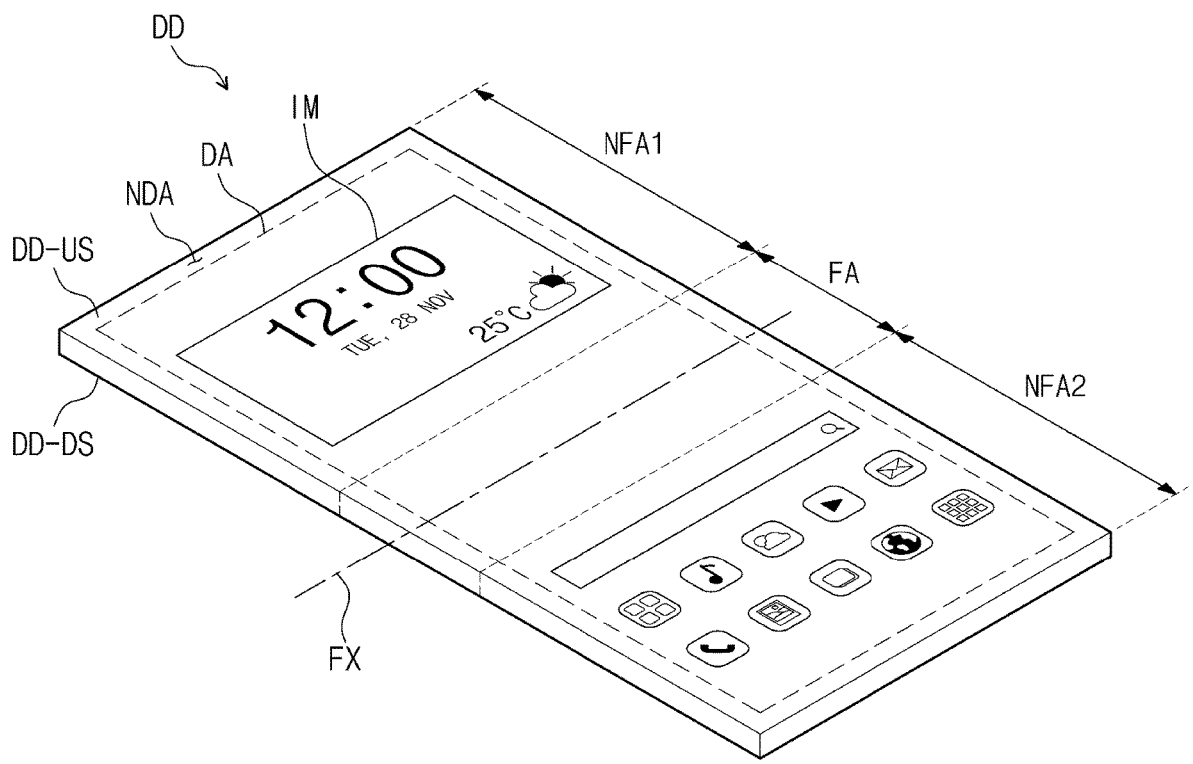
FIG. 1 is a schematic perspective view illustrating a display device according to an embodiment of the inventive concept.

Embodiments are now described with reference to the figures, where like reference numerals refer to like elements throughout. In the figures, the thickness, ratio, and dimensions of components may be exaggerated for clarity of illustration.

In this disclosure, it will also be understood that when one component (or region, layer, portion) is referred to as being "on", "connected to", or "coupled to" another component, it can be directly disposed/connected/coupled on/to the one component, or an intervening third component may also be present.

The term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

The phrase "at least one of" is intended to include the meaning of "at least one selected from the group of" for the purpose of its meaning and interpretation. For example, "at least one of A and B" may be understood to mean "A, B, or A and B."

It will be understood that although terms such as "first" and "second" may be used herein to describe various elements, these elements should not be limited by these terms. For example, these terms may be used only to distinguish one component from other components. For example, a first element referred to as a first element in one embodiment can be referred to as a second element in another embodiment without departing from the scope of the appended claims. The terms of a singular form may include plural forms.

Terms such as "under", "below", "above", "upper", and the like may be used for explaining relational association of components illustrated in the drawings. The terms may be a relative concept and described based on directions expressed in the drawings. The components should not be limited by these terms.

Unless otherwise defined, all terms (including technical and scientific terms) used herein have the same meaning as generally understood by those skilled in the art. Terms as defined in a commonly used dictionary should be construed as having the same meaning as in an associated technical context, and unless apparent in the description, the terms should not be ideally or excessively construed as having formal meaning.

Terms such as "include", "has", and "comprise" specify the presence of a property, a fixed number, a step, an operation, an element, a component or a combination thereof, but do not exclude other properties, fixed numbers, steps, operations, elements, components or combinations thereof.

The term "overlap" may include "layer", "stack", "face" or "facing", "extending over", "extending under", "covering" or "partly covering" or any other suitable term as would be appreciated and understood by those of ordinary skill in the art. The phrase "not overlap" may include 'apart from' or 'set aside from' or 'offset from' and any other suitable equivalents as would be appreciated and understood by those of ordinary skill in the art.

Figure 2A:
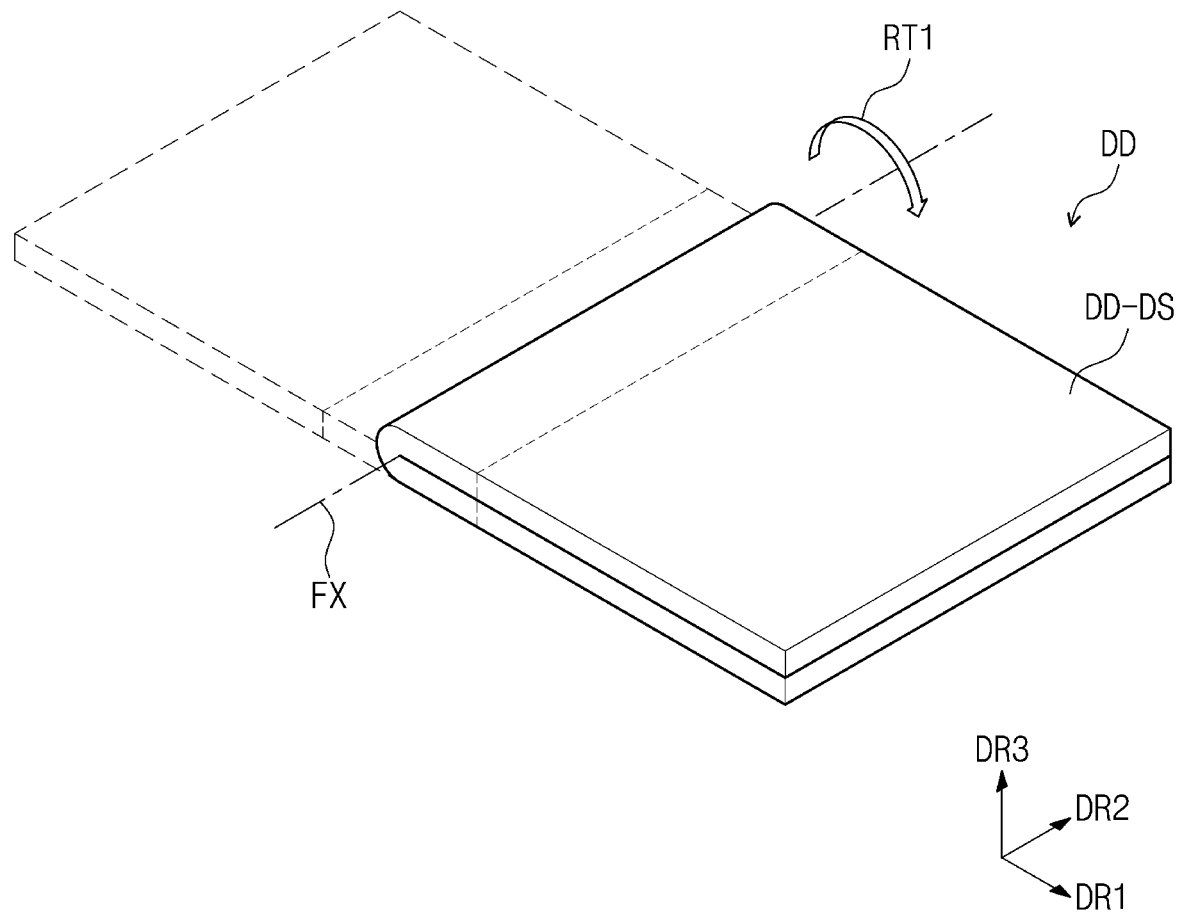
FIG. 2A is a schematic perspective view illustrating the display device folded with respect to a folding axis according to an embodiment of the inventive concept.
Figure 2B:
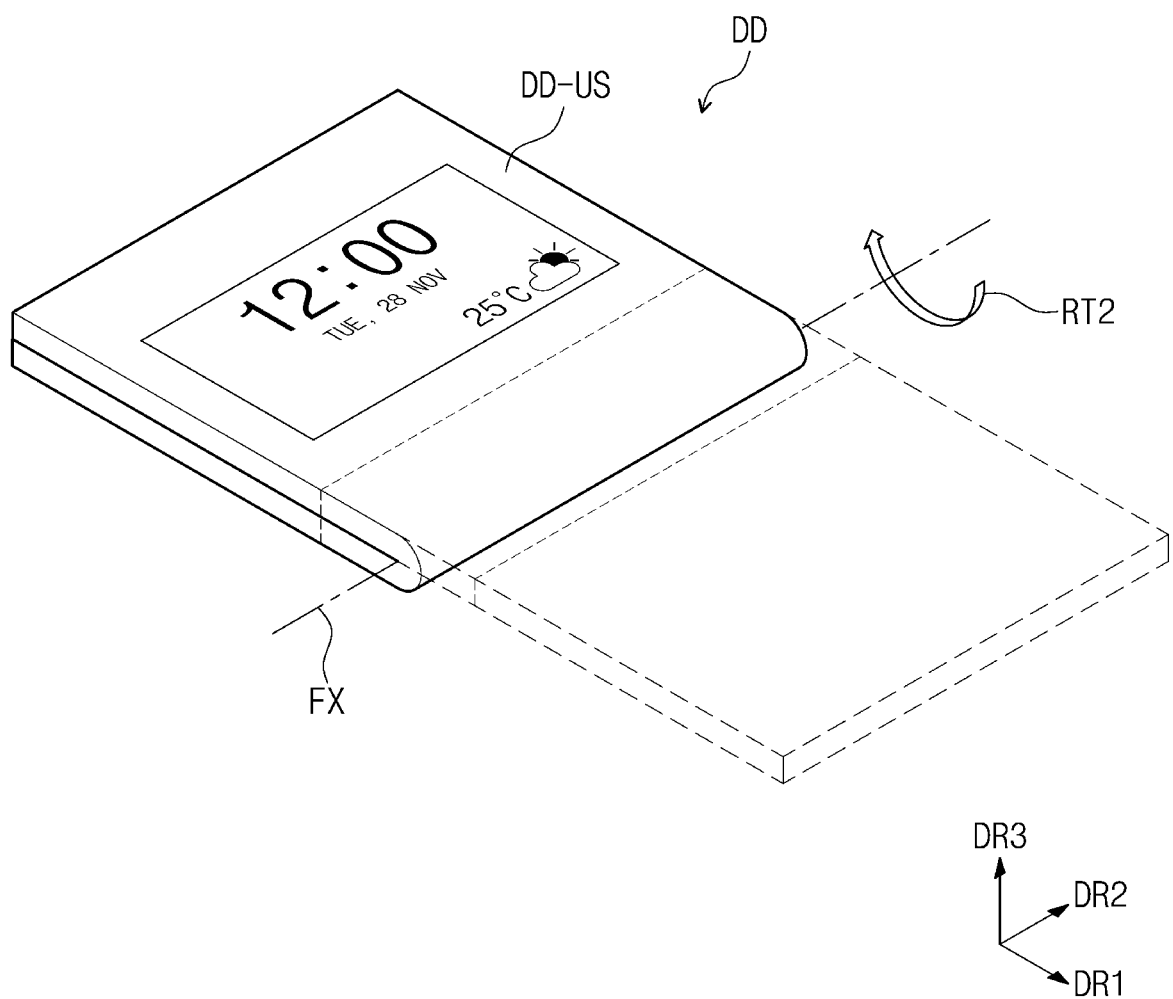
FIG. 2B is a schematic perspective view illustrating the display device folded with respect to the folding axis according to an embodiment of the inventive concept.

FIG. 1 is a schematic perspective view illustrating a display device according to an embodiment of the inventive concept. FIG. 2A is a schematic perspective view illustrating the display device folded with respect to a folding axis according to an embodiment of the inventive concept. FIG. 2B is a schematic perspective view illustrating the display device folded with respect to the folding axis according to an embodiment of the inventive concept.

According to an embodiment of the inventive concept, although a foldable display device is illustrated, embodiments of the inventive concept are not limited thereto. For example, the display device DD may include various display devices such as a curved display device, a bendable display device, a rollable display device, and a stretchable display device. The display device DD according to an embodiment of the inventive concept may be used for large-sized electronic devices such as televisions, monitors, or outdoor advertisement boards and small and medium-sized electronic devices such as mobile phones, personal computers, notebook computers, personal digital terminals, navigation units for vehicles, game consoles, portable electronic devices, wrist watch type electronic devices, and cameras.

Referring to FIG. 1, the display device DD may include areas distinguished on a display surface. The display surface may be distinguished into a display area DA on which an image IM may be displayed and a non-display area NDA on which the image IM may not be displayed. The non-display area NDA may be an area disposed adjacent to the display area DA. For example, the display device DD in FIG. 1 may be provided as a rectangular shaped smartphone and may display the image IM, which may include, e.g., weather information and icons. The non-display area NDA may be adjacent to or surround the display area DA, or omitted according to another embodiment.

The display surface may be parallel to a surface defined by a first direction DR1 and a second direction DR2. A normal direction of the display surface, i.e., a thickness direction of the display device DD, may indicate a third direction DR3. In this specification, an expression of "when viewed from a plane or on a plane" may represent a case when viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions.

The display device DD according to an embodiment of the inventive concept may include a folding area FA folded along a folding axis FX, a first non-folding area NFA1, and a second non-folding area NFA2. The first non-folding area NFA1 and the second non-folding area NFA2 may be spaced apart from each other with the folding area FA therebetween in the first direction DR1. The folding axis FX may be parallel to the second direction DR2.

A top surface DD-US of the display device DD may include a first display surface overlapping the folding area FA, a second display surface overlapping the first non-folding area NFA1, and a third display surface overlapping the second non-folding area NFA2. A bottom surface DD-DS of the display device DD may be opposite to the top surface DD-US. The first to third display surfaces may display an image or may each display a different image.

Referring to FIGS. 2A and 2B, the display device DD according to an embodiment of the inventive concept may be folded in both directions with respect to the folding axis FX.

Referring to FIG. 2A, the folding area FA may be folded along the folding axis FX so that the second display surface and the third display surface face each other. The folding area FA may be folded along a first rotation axis RT1, and the bottom surface DD-DS of the display device DD may be exposed to the outside.

Referring to FIG. 2B, the folding area FA may be folded along the folding axis FX so that the second display surface and the third display surface may be exposed to the outside. The folding area FA may be folded along a second rotation axis RT2, and the top surface DD-US of the display device DD may be exposed to the outside.

As described above, the display device DD may be folded along the folding axis FX so that the second display surface of the first non-folding area NFA1 and the third display surface of the second non-folding area NFA2 face each other, and this may be defined as an inner folding. The display device DD may be folded along the folding axis FX so that the second display surface of the first non-folding area NFA1 and the third display surface of the second non-folding area NFA2 face to the outside, and this may be defined as an outer folding.

Figure 3:
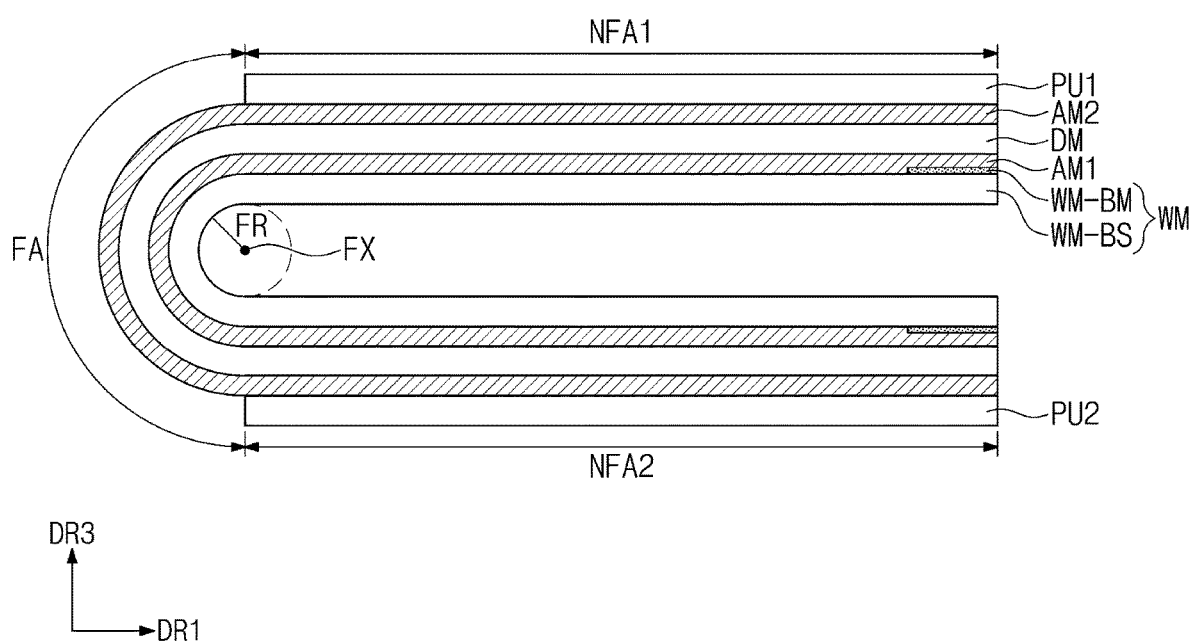
FIG. 3 is a schematic cross-sectional view illustrating the folded display device according to an embodiment of the inventive concept.

FIG. 3 is a schematic cross-sectional view illustrating the folded display device according to an embodiment of the inventive concept. Referring to FIG. 3, the inner-folded display device DD is disclosed. In case the display device DD may be inner-folded, an inner space of the display device may be defined along a curvature radius FR. According to an embodiment of the inventive concept, although the inner space may be defined in case the display device DD may be inner or outer-folded, embodiments of the inventive concept are not limited thereto. For example, in case the display device DD may be inner or outer-folded, the inner space may not be defined.

The display device DD includes a window WM, a display part DM, reinforcing members PU1 and PU2, and adhesive layers AM1 and AM2. According to an embodiment of the inventive concept, each of the display part DM and the window WM may have a flexible property and defined the folding area FA, the first non-folding area NFA1, and the second non-folding area NFA2.

The window WM may be disposed on the display part DM and includes a base layer WM-BS and a light shielding layer WM-BM. The base layer WM-BS may include a front surface and a rear surface. The front surface of the base layer WM-BS may correspond to the top surface DD-US of the display device DD. The light shielding layer WM-BM may be disposed on the rear surface, which faces the display part DM, of the base member WM-BS to define the non-display area NDA of the display device DD in FIG. 1.

For example, the window layer WM-BS may include a glass substrate, a sapphire substrate, a plastic film, or a combination thereof. The light shielding layer WM-BM may be a colored organic layer and provided by, e.g., a coating method. However, embodiments of the inventive concept are not limited thereto. For example, in case the entire front surface of the display part DM may be the display surface, the light shielding layer WM-BM may be omitted.

The display part DM may be disposed between the window WM and the reinforcing members PU1 and PU2. The display part DM may include a display panel DP and an input sensing layer ISU (refer to FIG. 4). The display panel DP may generate an image and transmit the generated image to the window WM. The input sensing layer ISU may detect an external input.

The adhesive layers AM1 and AM2 may include a first adhesive layer AM1 and a second adhesive layer AM2. The first adhesive layer AM1 may be disposed between the display part DM and the window WM, and the second adhesive layer AM2 may be disposed between the reinforcing members PU1 and PU2 and the display part DM. Particularly, the adhesive layers AM1 and AM2 according to an embodiment of the inventive concept may be made of an optically clear resin. For example, the first adhesive layer AM1 may be provided by applying a first adhesive material contained in a first external application instrument, and the second adhesive layer AM2 may be provided by applying a second adhesive material contained in a second external application instrument.

According to an embodiment of the inventive concept, the adhesive layers AM1 and AM2 overlapping the folding area FA may include different kinds of adhesive materials. For example, the adhesive layers AM1 and AM2 overlapping the folding area FA may include the first adhesive material and the second adhesive material having an elongation rate greater than that of the first adhesive material.

Particularly, in the folding area FA, the second adhesive material may have a planar area greater than that of the first adhesive material. For example, in the folding area FA, the second adhesive material may have an overall density greater than that of the first adhesive material. On the other hand, in each of the non-folding areas NFA1 and NFA2, the first adhesive material may have a planar area greater than that of the second adhesive material. For example, in each of the non-folding areas NFA1 and NFA2, the first adhesive material may have an overall density greater than that of the first adhesive material.

According to the above description, each of the adhesive layers AM1 and AM2 overlapping the folding area FA may have a modulus less than that of each of the adhesive layers AM1 and AM2 overlapping the non-folding areas NFA1 and NFA2. As a result, a physical property of each of the adhesive layers AM1 and AM2 overlapping the folding area FA may be prevented from being varied. For example, the adhesive layers AM1 and AM2 overlapping the folding area FA may have a flexibility to prevent generation of a crack caused by a folding.

As each of the adhesive layers AM1 and AM2 overlapping the non-folding areas NFA1 and NFA2 may have a modulus greater than that of each of the adhesive layers AM1 and AM2 overlapping the folding area FA, the adhesive layers AM1 and AM2 overlapping the non-folding areas NFA1 and NFA2 may have an impact resistance against an external impact.

According to an embodiment of the inventive concept, although the display device DD may include two adhesive layers AM1 and AM2, embodiments of the inventive concept are not limited thereto. For example, adhesive layers having substantially the same structure may be contained in the display device DD.

The reinforcing members PU1 and PU2 may include a first reinforcing member PU1 and a second reinforcing member PU2. The first reinforcing member PU1 may be disposed on the display part DM that may overlap the first non-folding area NFA1 and may be disposed on the display part DM that may overlap the second non-folding area NFA2.

The reinforcing members PU1 and PU2 may not overlap the display part DM overlapping the folding area FA. This may be because the display part DM may not be easily folded in case the reinforcing members PU1 and PU2 may be disposed on the display part DM overlapping the folding area FA.

Figure 4:
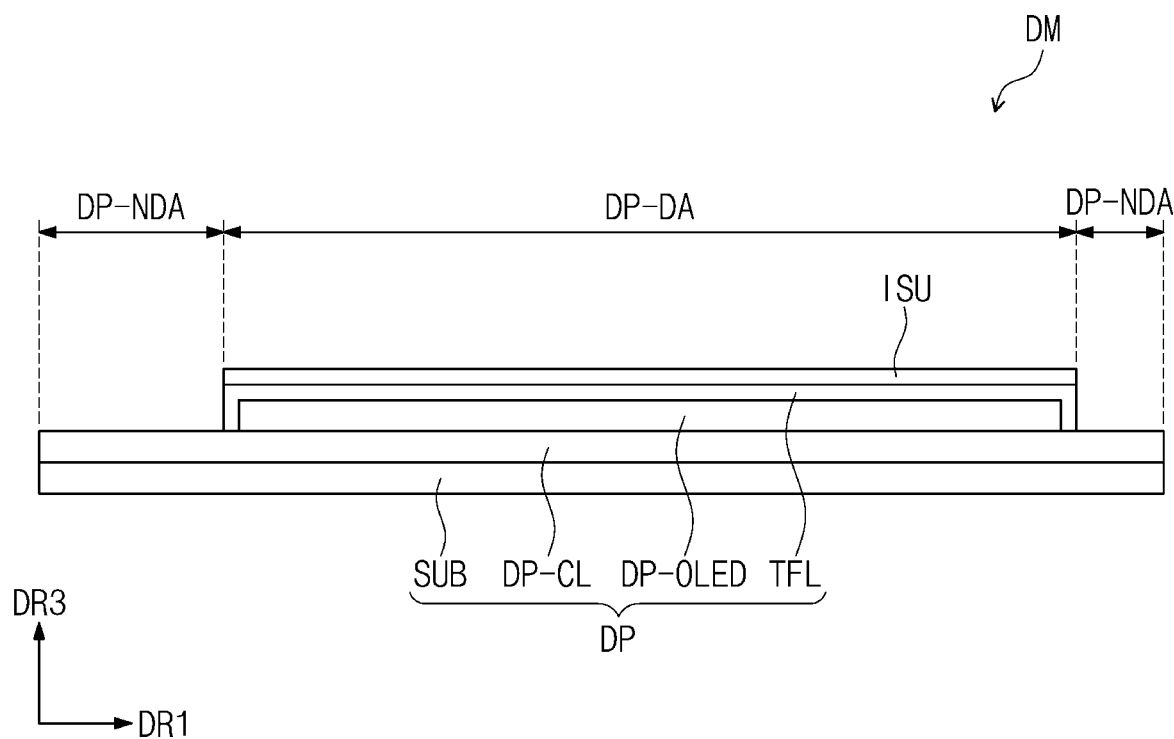
FIG. 4 is a schematic cross-sectional view illustrating a display part according to an embodiment of the inventive concept.
Figure 5A:
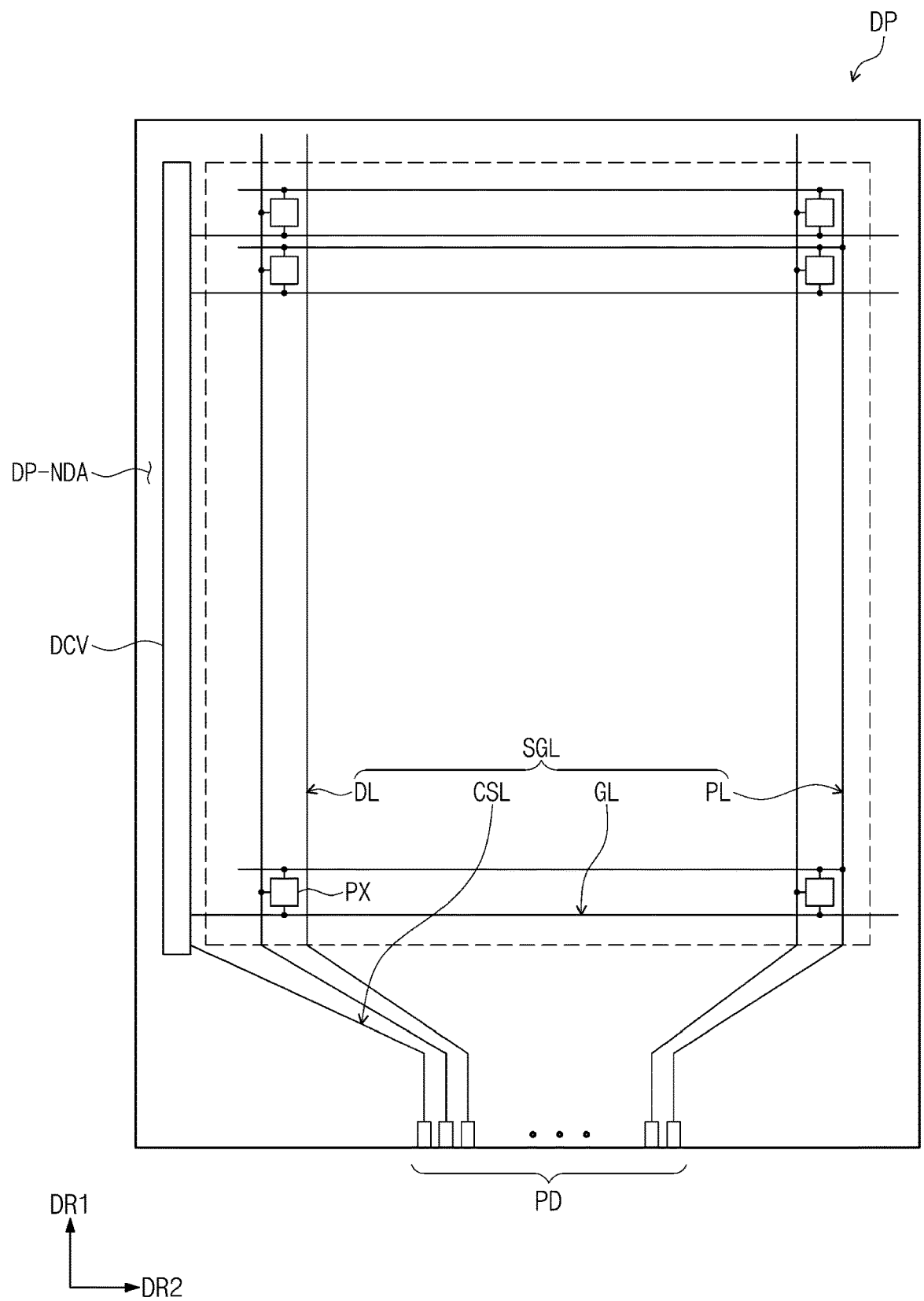
FIG. 5A is a schematic plan view illustrating a display panel in FIG. 4.
Figure 5B:
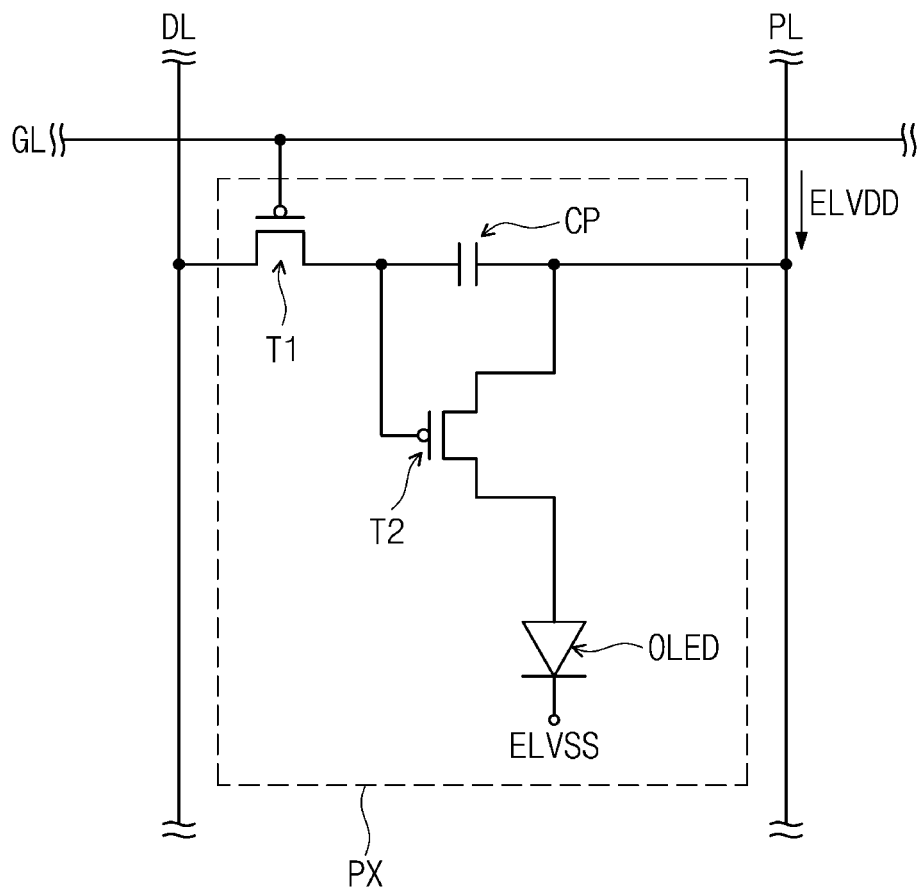
FIG. 5B is a schematic circuit view illustrating a pixel in FIG. 5A.
Figure 5C:
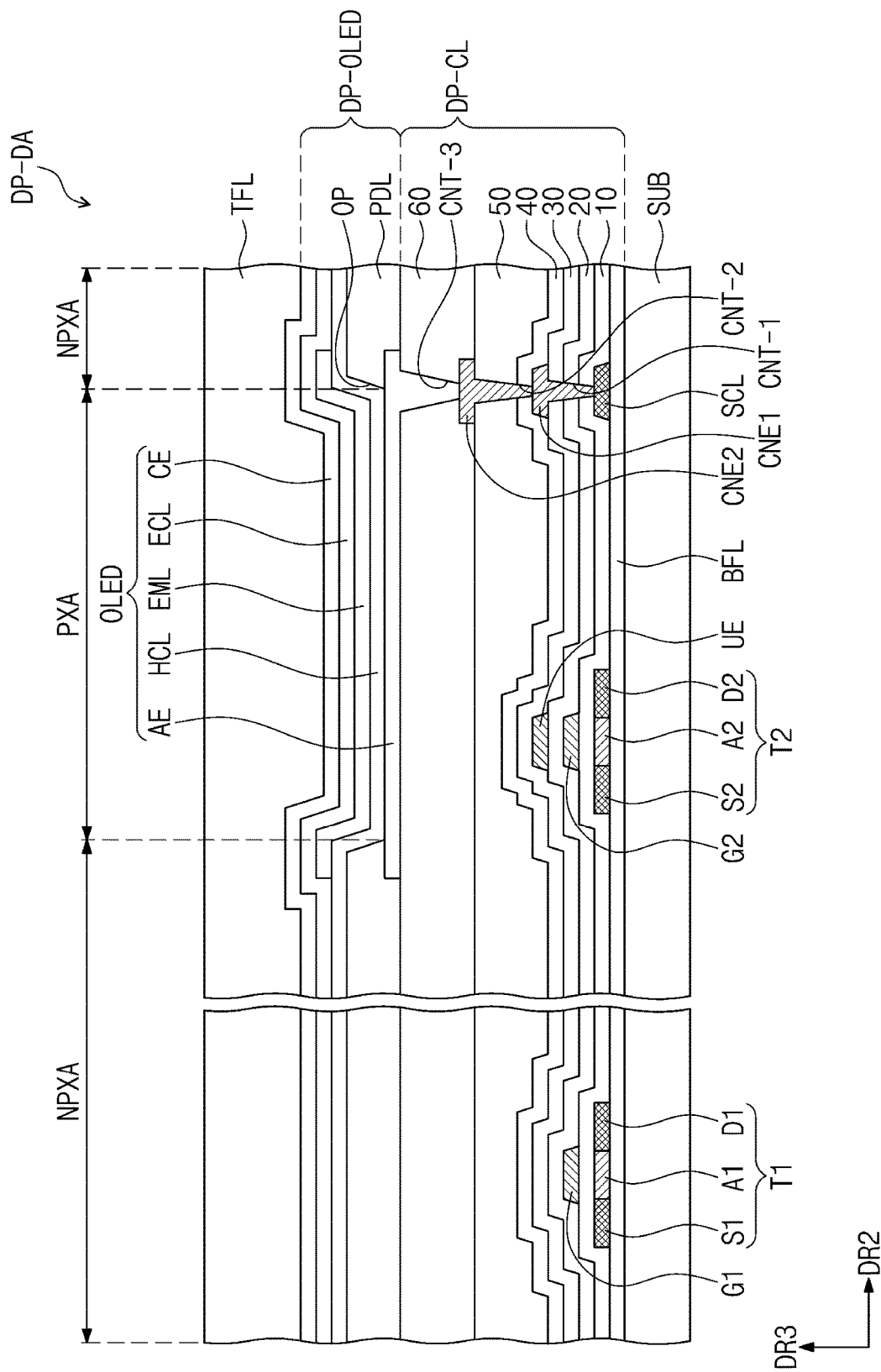
FIG. 5C is an enlarged schematic cross-sectional view illustrating the display panel according to an embodiment of the inventive concept.

FIG. 4 is a schematic cross-sectional view illustrating the display part according to an embodiment of the inventive concept. FIG. 5A is a schematic plan view illustrating the display panel in FIG. 4. FIG. 5B is a schematic circuit diagram illustrating a pixel in FIG. 5A. FIG. 5C is an enlarged schematic cross-sectional view illustrating the display panel according to an embodiment of the inventive concept.

Referring to FIG. 4, the display part DM may include a display panel DP and an input sensing layer ISU. The display panel DP may include a base substrate SUB, a circuit element layer DP-CL disposed on the base substrate SUB, a display element layer DP-OLED, and an insulation layer TFL. According to an embodiment of the inventive concept, the display panel DP may be a light emitting display panel. However, embodiments of the inventive concept are not limited to the kind of the display panel. For example, the display panel DP may be an organic light emitting display panel, a quantum dot light emitting display panel, or a liquid crystal display panel. The organic light emitting display panel may include a light emitting layer containing an organic light emitting material. The quantum dot light emitting display panel may include a light emitting layer containing a quantum dot and a quantum rod.

Hereinafter, the display panel DP according to an embodiment of the inventive concept will be described as an organic light emitting display panel. However, embodiments of the inventive concept are not limited thereto. For example, the embodiment of the inventive concept may include various display panels.

The display panel DP may include a display area DP-DA and a non-display area DP-NDA. The display area DP-DA of the display panel DP may correspond to the display area DD-DA in FIG. 1, and the non-display area DP-NDA may correspond to the non-display area DD-NDA in FIG. 1.

The base substrate SUB may include at least one plastic film. The base substrate SUB that may be a flexible substrate may include a plastic substrate, a glass substrate, a metal substrate, an organic/inorganic composite substrate, or a combination thereof.

The circuit element layer DP-CL may include at least one intermediate insulation layer and a circuit element. The intermediate insulation layer may include at least one intermediate inorganic layer and at least one intermediate organic layer. The circuit element may include signal lines, a driving circuit of a pixel, etc.

The display element layer DP-OLED may include organic light emitting diodes. The display element layer DP-OLED may further include an organic layer such as a pixel defining layer. According to another embodiment, in case the display panel may be provided as a liquid crystal display panel, the display element layer may be provided as a liquid crystal layer.

The insulation layer TFL may seal the display element layer DP-OLED. For example, the insulation layer TFL may be a thin-film encapsulation layer including, e.g., insulation layers. The insulation layer TFL may protect the display element layer DP-OLED from foreign substances such as moisture, oxygen, and dust particles. However, embodiments of the inventive concept are not limited thereto. For example, an encapsulation substrate may be provided instead of the insulation layer TFL. The encapsulation substrate may face the base substrate SUB with the circuit element layer DP-CL and the display element layer DP-OLED therebetween.

The input sensing layer ISU may be disposed between the window WM and the display panel DP. The input sensing layer ISU may detect an input applied from the outside. The input applied from the outside may be provided as various types. For example, the external input may include various types of external inputs such as a portion of a user's body, a stylus pen, light, heat, or pressure. In addition to a contact input generated by a portion of the user's body such as the user's hands, a space touch (e.g., hovering) generated by the input sensing layer ISU being approached, e.g., the user's hands or such being adjacent to the input sensing layer ISU may be one type of the inputs.

The input sensing layer ISU may be disposed on (e.g., directly disposed on) the display panel DP. In this specification, an expression "a component A is disposed directly on a component B" may represent that an additional adhesive layer may not be disposed between the component A and the component B. In an embodiment, the input sensing layer ISU may be manufactured by a continuous process in conjunction with the display panel DP. However, embodiments of the inventive concept are not limited thereto. For example, the input sensing layer ISU may be provided as an individual panel and coupled with the display panel DP through an adhesive layer. As another example, the input sensing layer ISU may be omitted.

Referring to FIG. 5A, the display panel DP may include a scan driving circuit DCV, signal lines SGL, pixels PX, and driving pads PD. The pixels PX may overlap the display area DP-DA. The scan driving circuit DCV, the signal lines SGL, and the pixel driving circuit may be contained in the circuit element layer DP-CL in FIG. 4.

The scan driving circuit DCV may overlap the non-display area DP-NDA and generate scan signals. The scan signals may be sequentially outputted to gate lines GL that will be described later. The scan driving circuit DCV may further output another control signal to the driving circuit of the pixels PX.

The scan driving circuit DCV may include thin-film transistors that may be formed through the same process as the driving circuit of the pixels PX, e.g., a low temperature polycrystalline silicon (LTPS) process or a low temperature polycrystalline oxide (LTPO) process.

Signal lines SGL may include gate lines GL, data lines DL, a power line PL, and a control signal line CSL. The gate lines GL may be electrically connected to the corresponding pixels PX of the pixels PX, respectively, and the data lines DL may be electrically connected to the corresponding pixels PX of the pixels PX, respectively. The power line PL may be electrically connected to the pixels PX. The control signal line CSL may provide control signals to the scan driving circuit DCV.

The display panel DP may include the driving pads PD that may be electrically connected to the data lines DL, the power line PL, and the control signal line CSL. The driving pads PD may overlap the non-display area DP-NDA.

Referring to FIG. 5B, the display area DP-DA may be defined as an area on which the pixels PX may be disposed. Each of the pixels PX may include an organic light emitting diode OLED and a pixel driving circuit electrically connected thereto.

Particularly, the pixel PX may include a first transistor T1, a second transistor T2, a capacitor CP, and an organic light emitting diode OLED. Although the pixel driving circuit may be required to include a switching transistor and a driving transistor, embodiments of the inventive concept are not limited to the embodiment in FIG. 5B. Although each of the first transistor T1 and the second transistor T2 may be a p-MOS transistor in FIG. 5B, embodiments of the inventive concept are not limited thereto. For example, each of the first transistor T1 and the second transistor T2 may be an n-MOS transistor.

The first transistor T1 may be electrically connected to the gate line GL and the data line DL. The organic light emitting diode OLED may receive a first power voltage ELVDD and a second power voltage ELVSS, which may be provided by the power line PL. The first power voltage ELVDD may be provided to the first transistor of the organic light emitting diode OLED through the second transistor T2, and the second power voltage ELVSS may be provided to the second transistor of the organic light emitting diode OLED. The second power voltage ELVSS may be less than the first power voltage ELVDD.

Referring to FIG. 5C, the display area DP-DA may include insulation layers, a semiconductor pattern, a conductive pattern, a signal line, etc. The insulation layer, the semiconductor layer, and the conductive layer may be provided by a method such as coating and deposition. Thereafter, the insulation layer, the semiconductor layer, and the conductive layer may be selectively patterned by a photolithography method. By using the above-described method, the semiconductor pattern, the conductive pattern, and the signal line, which may be contained in the circuit element layer DP-CL and the display element layer DP-OLED, may be provided. In the display area DP-DA in FIG. 5C, the pixel driving circuit in FIG. 5A may include an additional element in comparison with the first transistor T1 and the second transistor T2. The base substrate SUB may be a base substrate supporting the circuit element layer DP-CL and the display element layer DP-OLED.

The base substrate SUB may include a synthetic resin film. The synthetic resin layer may include a thermosetting resin. The base substrate SUB may have a multilayer structure. For example, the base substrate SUB may have a three-layer structure including a synthetic resin layer, an adhesive layer, and a synthetic resin layer. Although the synthetic resin layer may include a polyimide-based resin layer, embodiments of the inventive concept are not limited to the material of the synthetic resin layer. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. The base layer may include a glass substrate, a metal substrate, an organic/inorganic composite substrate, or a combination thereof.

At least one inorganic layer may be provided on a top surface of the base substrate SUB. Although the inorganic layer may include at least one of an aluminum oxide, a titanium oxide, a silicon oxide, a silicon nitride, a silicon oxynitride, a zirconium oxide, and a hafnium oxide, embodiments of the inventive concept are not limited to the kind of the inorganic layer. The inorganic layer may have multiple layers. The inorganic layer having multiple layers may provide a barrier layer and/or a buffer layer. In this embodiment, the display area DP-DA includes a buffer layer BFL.

The buffer layer BFL may enhance a coupling force between the base substrate SUB and the semiconductor pattern. The buffer layer BFL may include a silicon oxide layer, a silicon nitride layer, or a combination thereof. The silicon oxide layer and the silicon nitride layer may be alternately laminated.

A semiconductor pattern may be disposed on the buffer layer BFL. The semiconductor pattern may include polysilicon. However, embodiments of the inventive concept are not limited thereto. For example, the semiconductor pattern may include amorphous silicon, a metal oxide, or a combination thereof.

FIG. 5C merely illustrates a portion of the semiconductor pattern. The semiconductor pattern may be further disposed on another area of the pixel PX on a plane. The semiconductor pattern may be arranged over the pixels PX based on a particular rule. The semiconductor pattern may have an electrical property that may be different according to whether doped or not. The semiconductor pattern may include a doped area and a non-doped area. The doped area may be doped with an n-type dopant or a p-type dopant. A p-type transistor may include a doped area that may be doped with the p-type dopant.

The doped area may have a conductivity greater than that of a non-doped area and substantially serve as an electrode or a signal line. The non-doped area may substantially correspond to an active region (or a channel) of the transistor. In other words, one portion of the semiconductor pattern may be the active region of the transistor, another portion may be a source or a drain of the transistor, and another portion may be a connection electrode or a connection signal line.

As illustrated in FIG. 5C, a source S1, an active region A1, and a drain D1 of the first transistor T1 may be provided from the semiconductor pattern, and a source S2, an active region A2, and a drain D2 of the second transistor T2 may be provided from the semiconductor pattern. The source S1 and S2 and the drain D1 and D2 extend from the active region A1 and A2 in opposite directions on a cross-section. FIG. 5C illustrates a portion of a connection signal line SCL provided from the semiconductor pattern. Although not separately shown, the connection signal line SCL may be electrically connected to the drain D2 of the second transistor T2 on a plane.

A first insulation layer 10 may be disposed on the buffer layer BFL. The first insulation layer 10 may overlap the pixels PX in common and covers the semiconductor pattern. The first insulation layer 10 may be an inorganic layer and/or an organic layer, and have a single-layer or multilayer structure. The first insulation layer 10 may include at least one of an aluminum oxide, a titanium oxide, a silicon oxide, a silicon nitride, a silicon oxynitride, a zirconium oxide, and a hafnium oxide. In an embodiment, the first insulation layer 10 may be a single-layered silicon oxide layer. In addition to the first insulation layer 10, an insulation layer of the circuit element layer DP-CL may be an inorganic layer and/or an organic layer, and have a single-layer or multilayer structure. The inorganic layer may include at least one of the above-described materials.

A gate G1 and G2 may be disposed on the first insulation layer 10. The gate G1 and G2 may be a portion of a metal pattern. The gate G1 and G2 may overlap the active region A1 and A2. The gate G1 and G2 may serve as a mask in a process of doping the semiconductor pattern.

A second insulation layer 20 covering the gate G1 and G2 may be disposed on the first insulation layer 10. The second insulation layer 20 may overlap the pixels PX in common. The second insulation layer 20 may be an inorganic layer and/or an organic layer, and have a single-layer or multilayer structure. In an embodiment, the second insulation layer 20 may be a single-layered silicon oxide layer.

An upper electrode UE may be disposed on the second insulation layer 20. The upper electrode UE may overlap the gate G2 of the second transistor T2. The upper electrode UE may be a portion of the metal pattern. The capacitor CP (refer to FIG. 5B) may be defined by a portion of the gate G2 and the upper electrode UE overlapping the same.

A third insulation layer 30 covering the upper electrode UE may be disposed on the second insulation layer 20. In an embodiment, the third insulation layer 30 may be a single-layered silicon oxide layer. A first connection electrode CNE1 may be disposed on the third insulation layer 30. The first connection electrode CNE1 may be electrically connected to the connection signal line SCL through a contact hole CNT-1 passing through the first to third insulation layers 10 to 30.

A fourth insulation layer 40 covering the first connection electrode CNE1 may be disposed on the third insulation layer 30. The fourth insulation layer 40 may be a single-layered silicon oxide layer. A fifth insulation layer 50 may be disposed on the fourth insulation layer 40. The fifth insulation layer 50 may be an organic layer. A second connection electrode CNE2 may be disposed on the fifth insulation layer 50. The second connection electrode CNE2 may be electrically connected to the first connection electrode CNE1 through a contact hole CNT-2 passing through the fourth insulation layer 40 and the fifth insulation layer 50.

A sixth insulation layer 60 covering the second connection electrode CNE2 may be disposed on the fifth insulation layer 50. The sixth insulation layer 60 may be an organic layer. A first electrode AE may be disposed on the sixth insulation layer 60. The first electrode AE may be electrically connected to the second connection electrode CNE2 through a contact hole CNT-3 passing through the sixth insulation layer 60. An opening OP may be defined in a pixel defining layer PDL. The opening OP of the pixel defining layer PDL may expose at least a portion of the first electrode AE.

As illustrated in FIG. 5C, the display area DP-DA may include a light emitting area PXA and a light shielding area NPXA disposed adjacent to the light emitting area PXA. The light shielding area NPXA may surround the light emitting area PXA. In an embodiment, the light emitting area PXA may be defined in correspondence to a portion of the first electrode AE exposed by the opening OP.

A hole control layer HCL may be disposed on the light emitting area PXA and the light shielding area NPXA in common. The hole control layer HCL may include a hole transport layer and a hole injection layer. A light emitting layer EML may be disposed on the hole control layer HCL. The light emitting layer EML may be disposed on an area corresponding to the opening OP. For example, the light emitting layer EML may be separately provided on each of the pixels.

An electron control layer ECL may be disposed on the light emitting layer EML. The electron control layer ECL may include an electron transport layer and further include an electron injection layer. The hole control layer HCL and the electron control layer ECL may be provided in common to the pixels by using an open mask. A second electrode CE may be disposed on the electron control layer ECL. The second electrode CE may have an integrated shape and may be disposed in the pixels PX in common.

An insulation layer TFL may be disposed on the second electrode CE. The insulation layer TFL may include thin-films.

Figure 6:
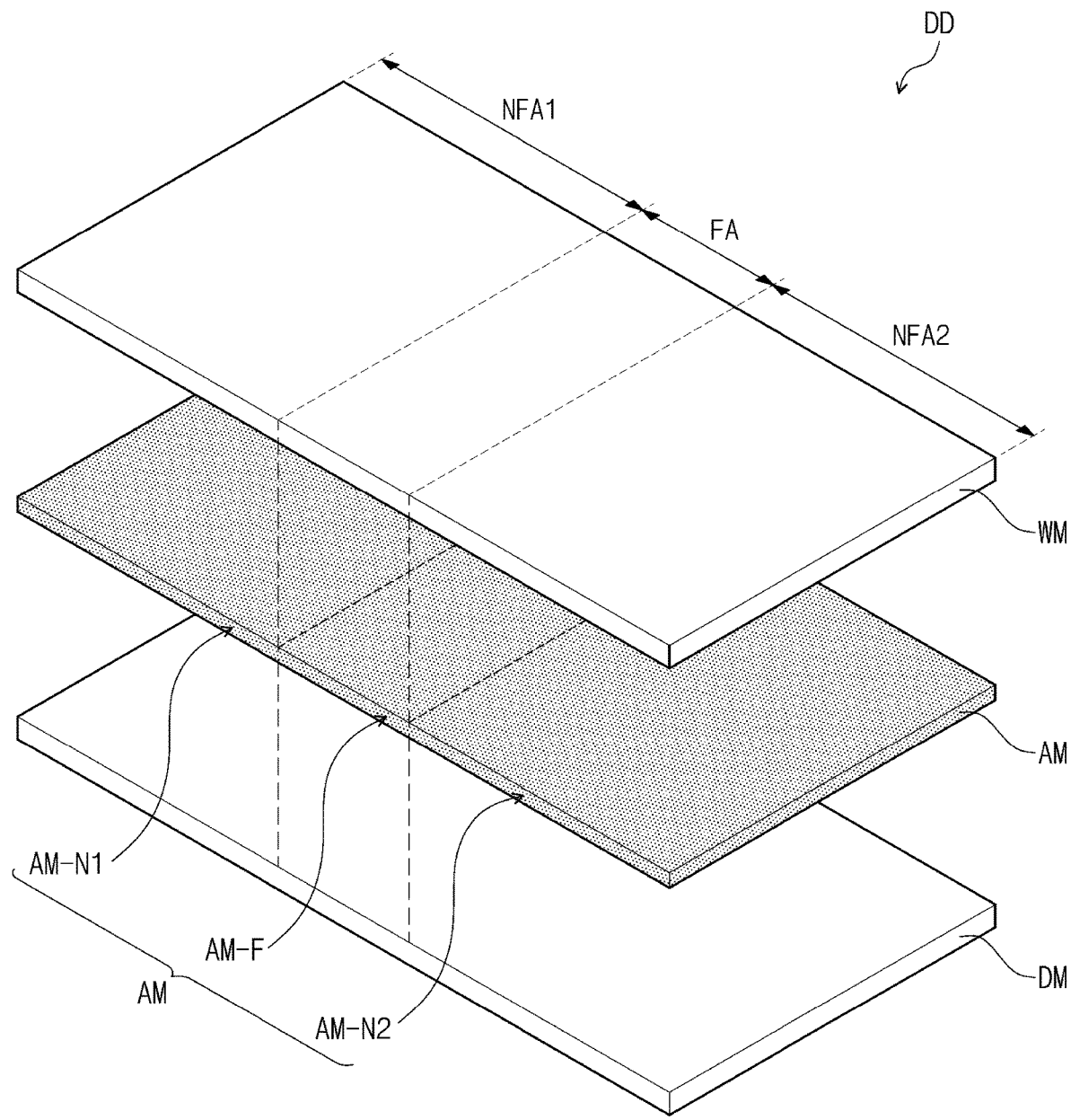
FIG. 6 is an exploded schematic perspective view illustrating the display device according to an embodiment of the inventive concept.
Figure 7A:
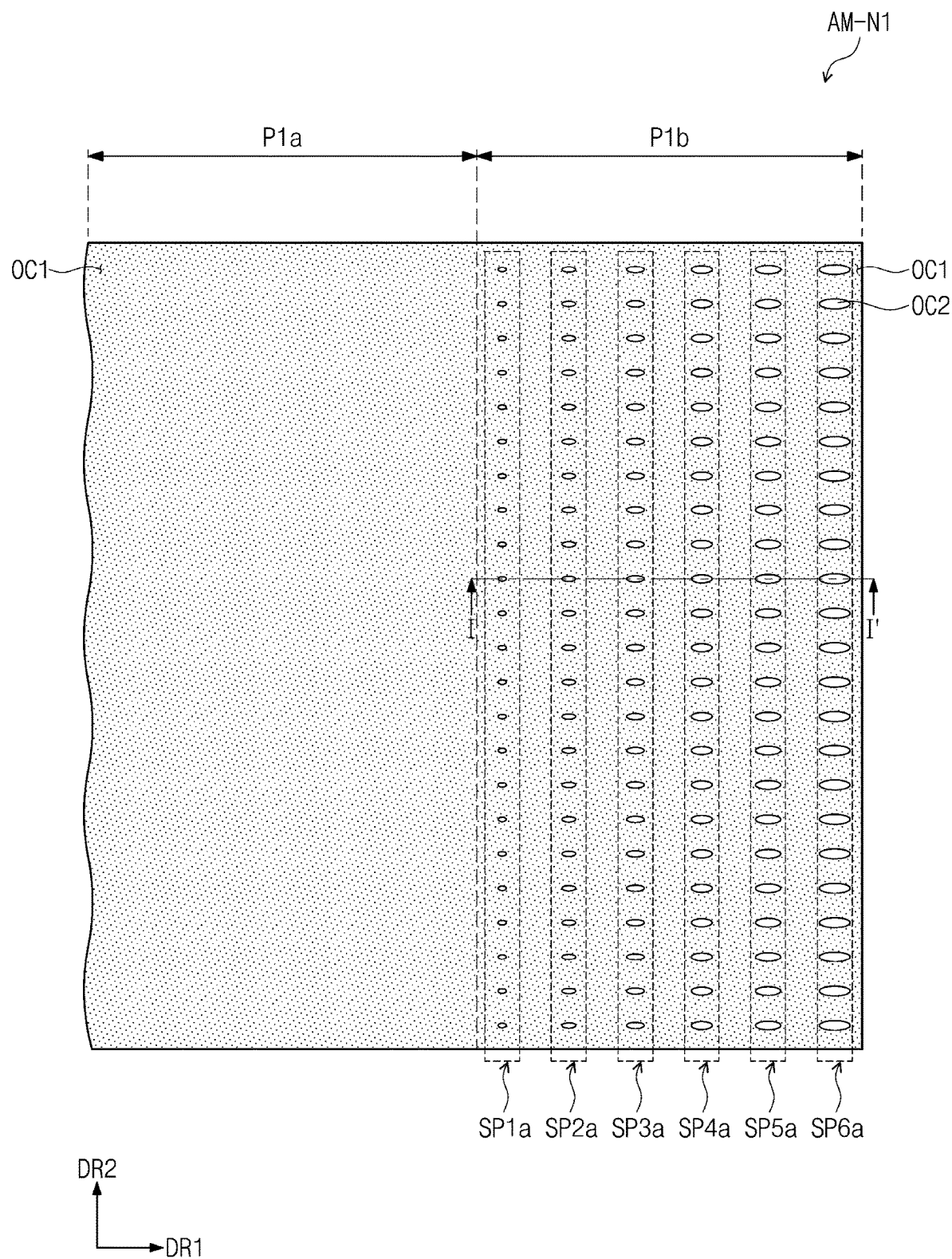
FIG. 7A is a schematic plan view illustrating a first adhesive area of an adhesive layer in FIG. 6 according to an embodiment of the inventive concept.
Figure 7B:
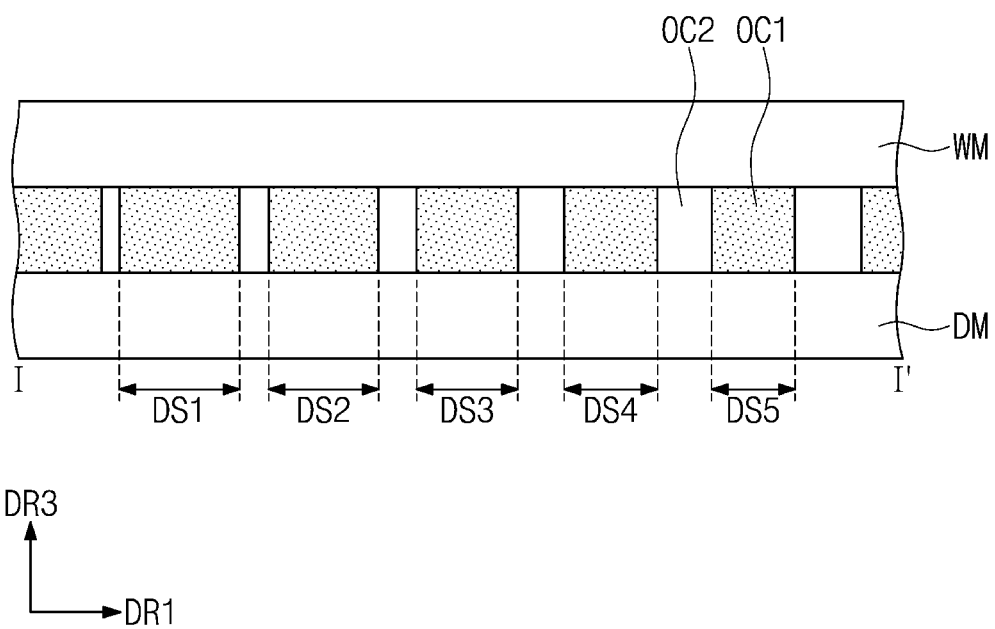
FIG. 7B is a schematic cross-sectional view taken along line I-I' of FIG. 7A according to an embodiment of the inventive concept.
Figure 7C:
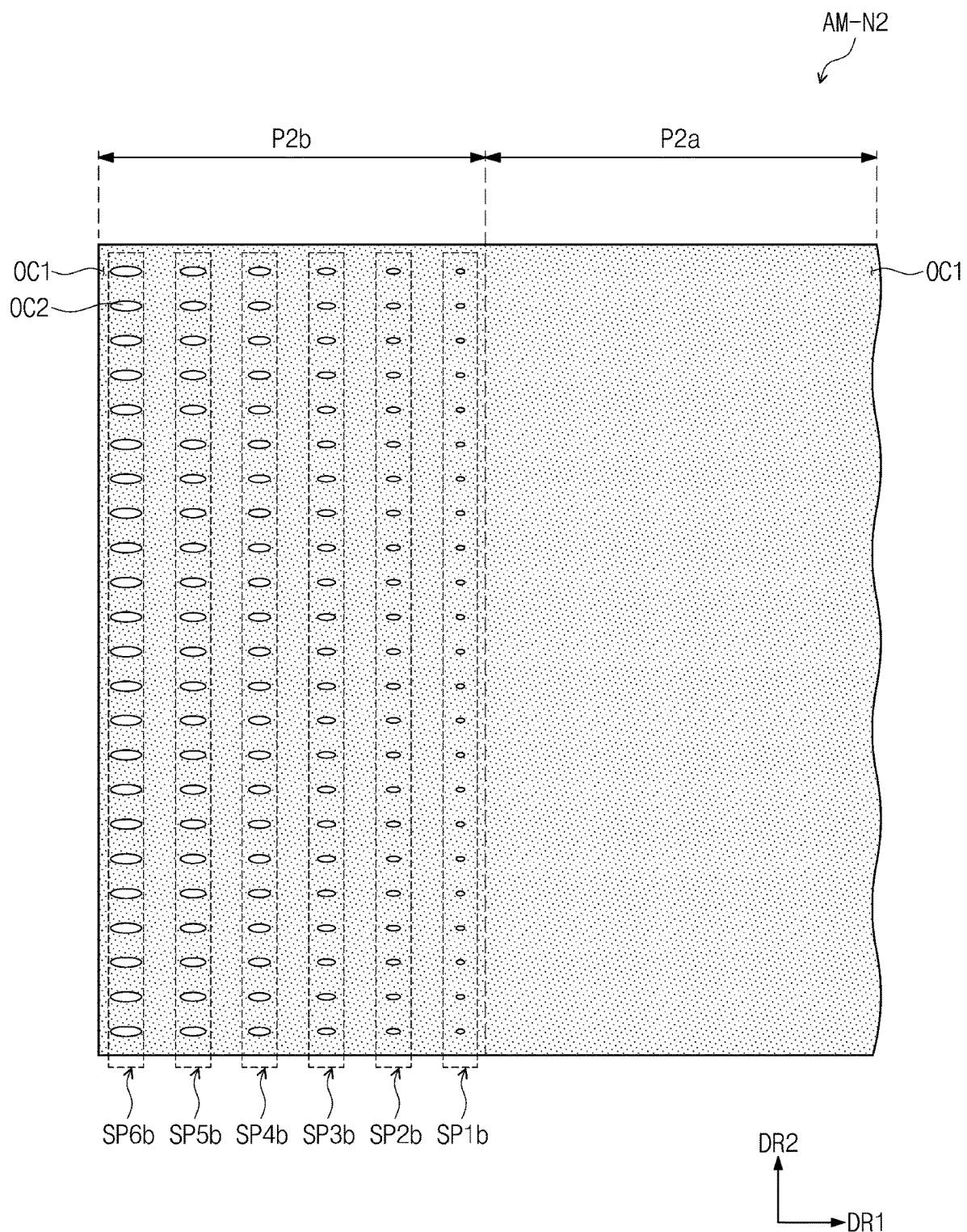
FIG. 7C is a schematic plan view illustrating a second adhesive area of the adhesive layer in FIG. 6 according to an embodiment of the inventive concept.

FIG. 6 is an exploded schematic perspective view illustrating the display device according to an embodiment of the inventive concept. FIG. 7A is a schematic plan view illustrating a first adhesive area of an adhesive layer in FIG. 6 according to an embodiment of the inventive concept. FIG. 7B is a schematic cross-sectional view taken along line I-I' of FIG. 7A according to an embodiment of the inventive concept. FIG. 7C is a schematic plan view illustrating a second adhesive area of the adhesive layer in FIG. 6 according to an embodiment of the inventive concept.

FIG. 6 illustrates an exploded perspective view of the display device DD in a non-folding state. An adhesive layer AM in FIG. 6 may correspond to the first adhesive layer AM1 of the adhesive layers AM1 and AM2 in FIG. 3. The second adhesive layer AM2 may also have a structure of the adhesive layer AM in FIG. 6.

Although not shown, an additional component may be further disposed between the first adhesive layer AM1 and the display part DM. For example, an optical control layer, which controls light incident from the outside, may be further provided between the first adhesive layer AM1 and the display part DM. For example, the optical control layer may be a polarizing layer controlling polarization of external light incident through the window WM. The first adhesive layer AM1 may be disposed between the window WM and the polarizing layer.

As another example, the optical control layer may be a color filter layer controlling external light incident through the window WM. The color filter layer may control external light by reflecting or absorbing the external light incident through the window WM. The first adhesive layer AM1 may be disposed between the window WM and the color filter layer.

Particularly, referring to FIG. 6, the adhesive layer AM may be disposed between the window WM and the display part DM. The adhesive layer AM defines a folding adhesive area AM-F corresponding to the folding area FA, a first adhesive area AM-N1 corresponding to the first non-folding area NFA1, and a second adhesive area AM-N2 corresponding to the second non-folding area NFA2. As described through FIG. 3, the adhesive layer AM may include a first adhesive material OC1 and a second adhesive material OC2 having an elongation rate greater than the first adhesive material OC1. The first adhesive material OC1 and the second adhesive material OC2 may be different kinds from each other and will be described referring to FIGS. 7A to 7C.

According to an embodiment of the inventive concept, in each of the first adhesive area AM-N1 and the second adhesive area AM-N2, the first adhesive material OC1 may have a planar area greater than that of the second adhesive material OC2. In the folding adhesive area AM-F, the second adhesive material OC2 may have a planar area greater than that of the first adhesive material OC1. In other words, in each of the first adhesive area AM-N1 and the second adhesive area AM-N2, the first adhesive material OC1 may have a density greater than that of the second adhesive material OC2. On the contrary, in the folding adhesive area AM-F, the second adhesive material OC2 may have a density greater than that of the first adhesive material OC1.

Particularly, referring to FIG. 7A, the first adhesive area AM-N1 includes a first sub-area P1a and a second sub-area P1b. The second sub-area P1b may be disposed between the first sub-area P1a and the folding adhesive area AM-F, and the first sub-area P1a may be greater than the second sub-area P1b on a plane.

According to an embodiment of the inventive concept, the overall first sub-area P1a of the first adhesive area AM-N1 may be provided through the first adhesive material OC1. For example, the second adhesive material OC2 may not overlap the first sub-area P1a.

The second adhesive material OC2 may be provided on the second sub-area P1b. According to an embodiment of the inventive concept, the second adhesive material OC2 provided on the second sub-area P1b may have a shape of first sub-adhesive patterns SP1a, SP2a, SP3a, SP4a, SP5a, and SP6a arranged in the first direction DR1 and each extending in the second direction DR2. Each of the first sub-adhesive patterns SP1a to SP6a may include first sub-adhesive parts that may be arranged with a distance from each other in the second direction DR2.

In this specification, although the second adhesive material OC2 may have the shape of the first sub-adhesive patterns SP1a, SP2a, SP3a, SP4a, SP5a, and SP6a, embodiments of the inventive concept are not limited thereto. For example, the second adhesive material OC2 may have a shape of at least two or more first sub-adhesive patterns.

The first adhesive material OC1 provided on the second sub-area P1b may surround the first sub-adhesive patterns SP1a to SP6a. For example, in the first adhesive area AM-N1, the first adhesive material OC1 may have an integrated shape connected to each other instead of a shape of a pattern.

Particularly, a first external application instrument may apply the first adhesive material OC1 to the area not corresponding to the first sub-adhesive patterns SP1a to SP6a. For example, the first external application instrument may not apply the first adhesive material to a space in which the first sub-adhesive patterns SP1a to SP6a may be provided. Thereafter, the second adhesive material OC2 may be applied to the second sub-area P1b according to the shape of the first sub-adhesive patterns SP1a to SP6a through a second external application instrument.

According to an embodiment of the inventive concept, in the second sub-area P1b, the first adhesive material OC1 may have a planar area greater than that of the second adhesive material OC2. In the second sub-area P1b, the first adhesive material OC1 may have a density greater than that of the second adhesive material OC2.

Hereinafter, the first sub-adhesive patterns SP1a to SP6a will be described separately as each of first to sixth patterns for convenience of description. In the first direction DR1, a first pattern SP1a may be disposed farthest from the folding adhesive area AM-F, and a sixth pattern SP6a may be disposed closest to the folding adhesive area AM-F.

As illustrated in FIG. 7A, the first sub-adhesive parts of each of the first patterns SP1a to SP6a may have the same area on a plane. On the contrary, two neighboring patterns of the first sub-adhesive patterns SP1a to SP6a may include the first sub-adhesive parts having different areas from each other.

According to an embodiment of the inventive concept, the first sub-adhesive parts contained in the first to sixth patterns SP1a to SP6a may have a planar area that gradually increases in a direction toward the folding adhesive area AM-F. For example, the first sub-adhesive parts of the second pattern SP2a may have a planar area greater than that of the first sub-adhesive parts of the first pattern SP1a. For example, the first sub-adhesive parts of the sixth pattern SP2a may have a greatest planar area, and the first sub-adhesive parts of the first pattern SP1a may have a smallest planar area among the first sub-adhesive parts contained in the first to sixth patterns SP1a to SP6a.

According to an embodiment of the inventive concept, a distance between the first sub-adhesive parts contained in the first to sixth patterns SP1a to SP6a may gradually decrease in the direction toward the folding adhesive area AM-F. Particularly, referring to FIG. 7B, in the first direction DR1, a distance between the first sub-adhesive part of the first pattern SP1a and the first sub-adhesive part of the second pattern SP2a may be a first length DS1. A distance between the first sub-adhesive part of the second pattern SP2a and the first sub-adhesive part of the third pattern SP3a may be a second length DS2. A distance between the first sub-adhesive part of the third pattern SP3a and the first sub-adhesive part of the fourth pattern SP4a may be a third length DS3. A distance between the first sub-adhesive part of the fourth pattern SP4a and the first sub-adhesive part of the fifth pattern SP5a may be a fourth length DS4. A distance between the first sub-adhesive part of the fifth pattern SP5a and the first sub-adhesive part of the sixth pattern SP6a may be a fifth length DS5.

According to an embodiment of the inventive concept, in the first direction DR1, each of the first to sixth lengths DS1 to DS6 (partially shown adjacent to DS5) may gradually decrease in the direction toward the folding adhesive area AM-F. For example, the second length DS2, which may be closer to the folding adhesive area AM-F, may be shorter than the first length DS1. The fifth length DS5, which may be closer to the folding adhesive area AM-F, may be shorter than the fourth length DS4.

As the first adhesive material OC1 may have a modulus and a density greater than those of the second adhesive material OC2 in the first adhesive area AM-N1, the first adhesive area AM-N1 may have an impact resistance against an external impact greater than the folding adhesive area AM-F.

Referring to FIG. 7C, the second adhesive area AM-N2 may include a third sub-area P2a and a fourth sub-area P2b. The fourth sub-area P2b may be disposed between the third sub-area P2a and the folding adhesive area AM-F, and the fourth sub-area P2b may have a planar area less than that of the third sub-area P2a.

According to an embodiment of the inventive concept, the overall third sub-area P2a of the second adhesive area AM-N2 may be provided through the first adhesive material OC1. For example, the second adhesive material OC2 may not overlap the third sub-area P2a.

The second adhesive material OC2 may be provided on the fourth sub-area P2b. According to an embodiment of the inventive concept, the second adhesive material OC2 provided on the fourth sub-area P2b may have a shape of second sub-adhesive patterns SP1b, SP2b, SP3b, SP4b, SP5b, and SP6b arranged in the first direction DR1 and each extending in the second direction DR2. Each of the second sub-adhesive patterns SP1b to SP6b may include second sub-adhesive parts that may be arranged with a distance from each other in the second direction DR2.

The first adhesive material OC1 provided on the fourth sub-area P2b may surround the second sub-adhesive patterns SP1b to SP6b. In the second adhesive area AM-N2, the first adhesive material OC1 may have an integrated shape connected to each other instead of a shape of a pattern.

The second sub-adhesive patterns SP1b to SP6b in FIG. 7C may have substantially the same structure as the first sub-adhesive patterns SP1a to SP6a in FIG. 7A. For example, in the fourth sub-area P2b, the first adhesive material OC1 may have a planar area greater than that of the second adhesive material OC2. In the fourth sub-area P2b, the first adhesive material OC1 may have a density greater than that of the second adhesive material OC2. Hereinafter, a structure of the second adhesive area AM-N2 in FIG. 7C will not be described for convenience of description.

Figure 8:
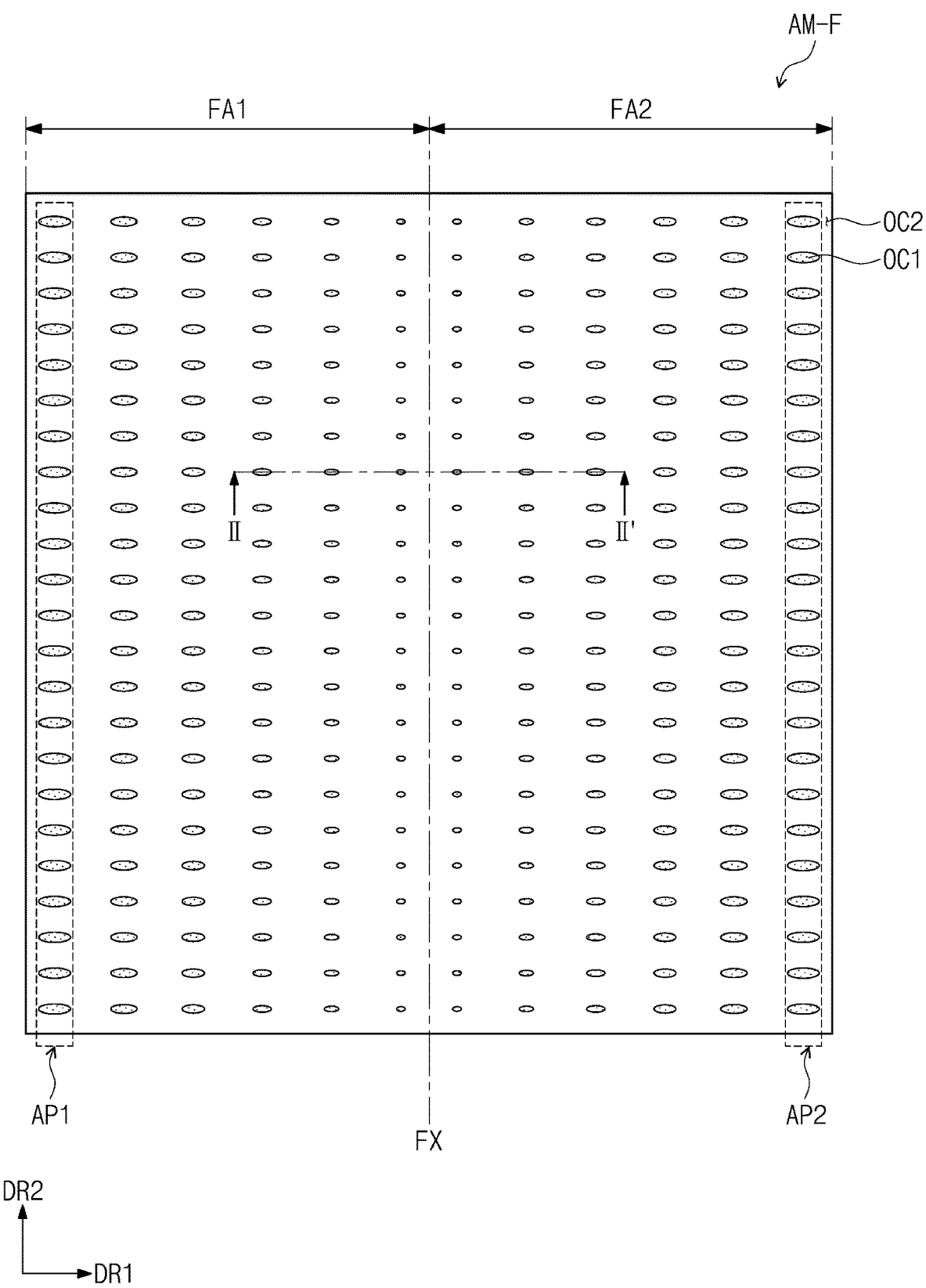
FIG. 8 is a schematic plan view illustrating a folding adhesive area of the adhesive layer in FIG. 6 according to an embodiment of the inventive concept.
Figure 9A:
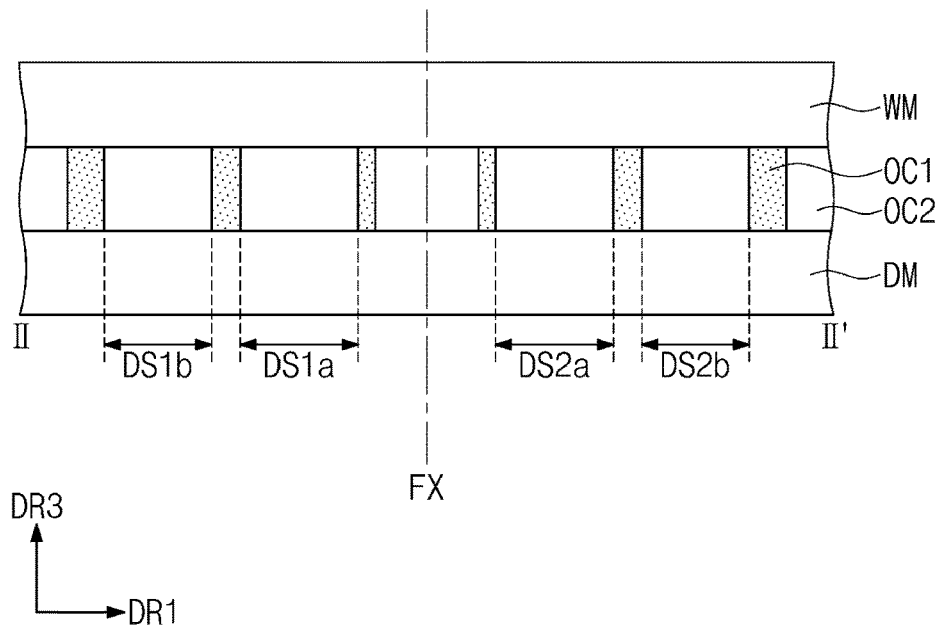
FIG. 9A is a schematic cross-sectional view taken along line II-II' of FIG. 8 according to an embodiment of the inventive concept.
Figure 9B:
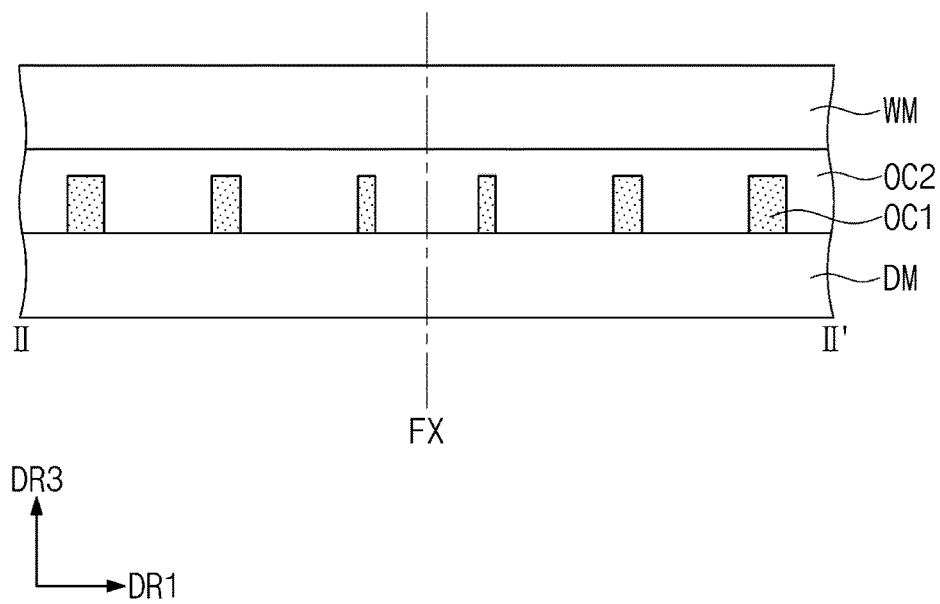
FIG. 9B is a schematic cross-sectional view taken along line II-II' of FIG. 8 according to another embodiment of the inventive concept.

FIG. 8 is a schematic plan view illustrating the folding adhesive area of the adhesive layer in FIG. 6 according to an embodiment of the inventive concept. FIG. 9A is a schematic cross-sectional view taken along line II-II' of FIG. 8 according to an embodiment of the inventive concept. FIG. 9B is a schematic cross-sectional view taken along line II-II' in FIG. 8 according to another embodiment of the inventive concept.

Referring to FIG. 8, the folding adhesive area AM-F includes a first area FA1 and a second area FA2, which may be divided with respect to a folding axis FX. The first area FA1 may be disposed between the second sub-area P1b of the first adhesive area AM-N1 and the second area FA2, and the second area FA2 may be disposed between the fourth sub-area P2b of the second adhesive area AM-N2 and the first area FA1.

According to an embodiment of the inventive concept, the first adhesive material OC1 provided on the folding adhesive area AM-F may have a shape of adhesive patterns arranged in the first direction DR1 and each extending in the second direction DR2. Each of the adhesive patterns includes adhesive parts arranged with a distance from each other in the second direction DR2.

On a plane, the second adhesive material OC2 provided on the folding adhesive area AM-F may surround the adhesive patterns. In the folding adhesive area AM-F, the second adhesive material OC2 may have an integrated shape connected to each other instead of a shape of a pattern.

The adhesive patterns include first adhesive patterns AP1 provided on the first area FA1 and second adhesive patterns AP2 provided on the second area FA2.

According to an embodiment of the inventive concept, a planar area of each of the first adhesive parts contained in the first adhesive patterns AP1 and the second adhesive parts contained in the second adhesive patterns AP2 may gradually decrease in a direction toward the folding axis FX. The first adhesive parts of each of the first adhesive patterns AP1 may have substantially the same planar area as each other, and the second adhesive parts of each of the second adhesive patterns AP2 may have substantially the same planar area as each other. Here, the term "substantially the same" may have a meaning including an error in a process.

Thus, in the folding adhesive area AM-F according to an embodiment of the inventive concept, the second adhesive material OC2 may have a planar area greater than that of the first adhesive material OC1. In the folding adhesive area AM-F, the second adhesive material OC2 may have a density greater than that of the first adhesive material OC1. As the second adhesive material OC2 may have an elongation rate greater than that of the first adhesive material OC1, the adhesive layer AM may not be deformed even by a folding operation of the folding adhesive area AM-F.

According to an embodiment of the inventive concept, in the first direction DR1, a distance between adhesive patterns contained in the two neighboring first adhesive patterns AP1 of the first adhesive patterns AP1 may gradually increase in the direction toward the folding axis FX. In the first direction DR1, a distance between adhesive patterns contained in the two neighboring second adhesive patterns AP2 of the second adhesive patterns AP2 may gradually increase in the direction toward the folding axis FX. Particularly, referring to FIG. 9A, three first adhesive patterns AP1 adjacent to the folding axis FX among the first adhesive patterns AP1 may be described as first to third patterns. The first pattern may be closer to the folding axis FX than the second pattern, and the second pattern may be closer to the folding axis FX than the third pattern.

A distance between an adhesive part of the first pattern and an adhesive pattern of the second pattern may be defined as a first length DS1$a$, and a distance between an adhesive part of the second pattern and an adhesive pattern of the third pattern may be defined as a second length DS1$b$. According to an embodiment of the inventive concept, the first length DS1$a$, which may be closer to the folding axis FX, may be longer than the second length DS1$b$.

Three second adhesive patterns AP2 adjacent to the folding axis FX among the second adhesive patterns AP2 may be described as fourth to sixth patterns. The fourth pattern may be closer to the folding axis FX than the fifth pattern, and the fifth pattern may be closer to the folding axis FX than the sixth pattern.

A distance between an adhesive part of the fourth pattern and an adhesive pattern of the fifth pattern may be defined as a first length DS2$a$, and a distance between an adhesive part of the fifth pattern and an adhesive pattern of the sixth pattern may be defined as a second length DS2$b$. According to an embodiment of the inventive concept, the first length DS2$a$, which may be closer to the folding axis FX, may be longer than the second length DS2$b$.

As illustrated in FIG. 9A, although the first adhesive material OC1 may not be entirely overlapped with the second adhesive material OC2 in the folding adhesive area AM-F, embodiments of the inventive concept are not limited thereto. For example, the first adhesive material OC1 may partially overlap the second adhesive material OC2 depending on a process.

Referring to FIG. 9B, in the folding adhesive area AM-F, the second adhesive material OC2 may entirely cover the first adhesive material OC1. For example, the first adhesive material OC1 may be provided on the folding adhesive area AM-F through a first external application instrument, and the second adhesive material OC2 may be provided over the entire folding adhesive area AM-F through a second external application instrument. As a result, the window WM and the display part DM may be attached to each other through the second adhesive material OC2 provided on the folding adhesive area AM-F.

FIG. 10 is a schematic plan view illustrating an adhesive layer according to another embodiment of the inventive concept.

Referring to FIG. 10, an adhesive layer AM-1 may include a folding adhesive area AM-F, a first adhesive area AM-N1, and a second adhesive area AM-N2. Particularly, the folding adhesive area AM-F of the adhesive layer AM-1 in FIG. 10 may have substantially the same structure as the folding adhesive area AM-F in FIG. 8. Thus, description on the structure will be omitted for convenience of description.

According to another embodiment of the inventive concept, each of the first adhesive area AM-N1 and the second adhesive area AM-N2 may be provided through the first adhesive material OC1. For example, the second adhesive material OC2 may not overlap the first adhesive area AM-N1 and the second adhesive area AM-N2.

Figure 11:
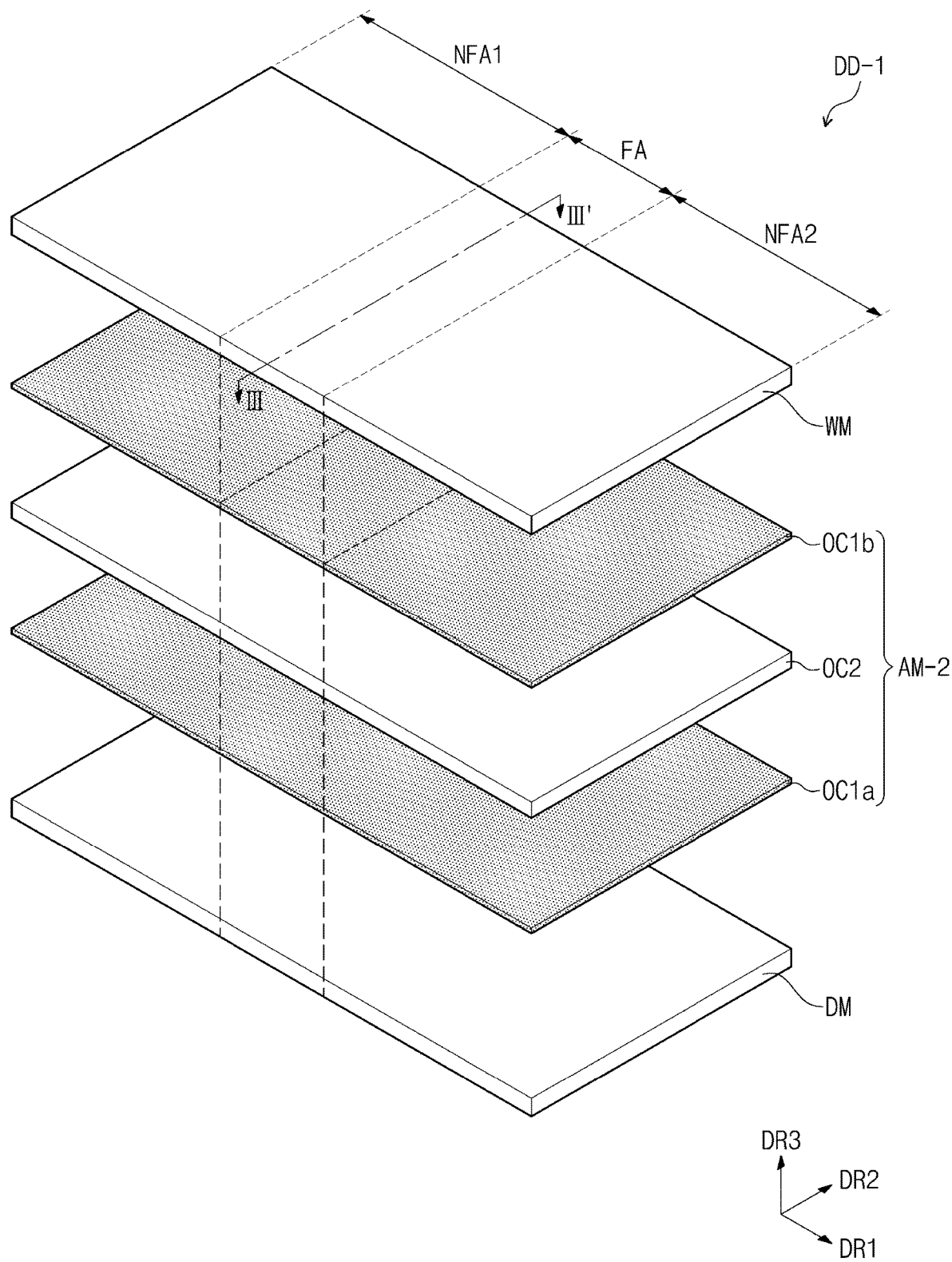
FIG. 11 is an exploded schematic perspective view illustrating a display device according to another embodiment of the inventive concept.
Figure 12:
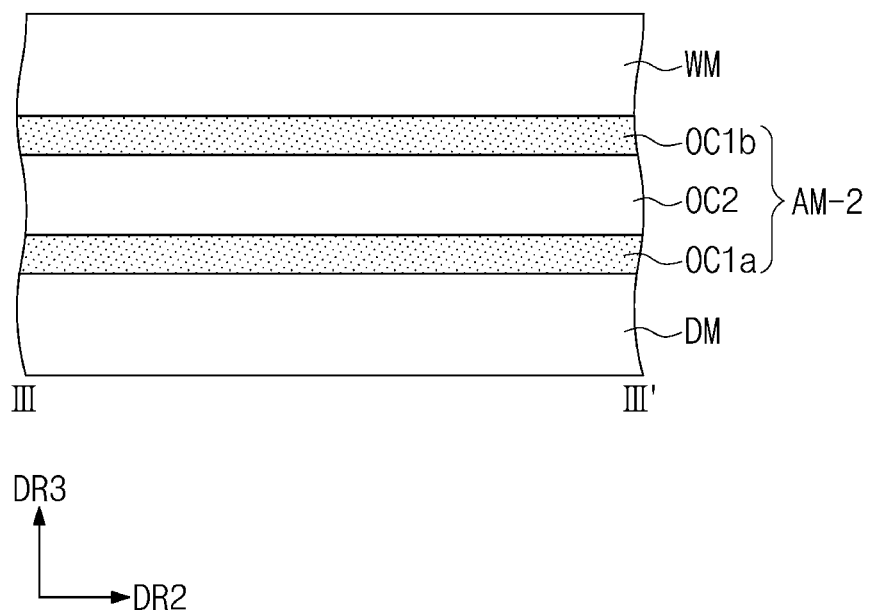
FIG. 12 is a schematic cross-sectional view taken along line of FIG. 11.

FIG. 11 is an exploded schematic perspective view illustrating a display device according to another embodiment of the inventive concept. FIG. 12 is a schematic cross-sectional view taken along line of FIG. 11.

A display device DD-1 in FIG. 11 may have substantially the same structure as the display device DD in FIG. 6 except for a configuration of an adhesive layer AM-2.

Particularly, referring to FIGS. 11 and 12, the adhesive layer AM-2 may include adhesive layers. Particularly, the adhesive layer AM-2 may include a first adhesive layer OC1$a$ and a second adhesive layer OC1$b$, which correspond to the first adhesive material, and a third adhesive layer OC2 corresponding to the second adhesive material.

The third adhesive layer OC2 may be disposed between the first adhesive layer OC1$a$ and the second adhesive layer OC1$b$. Particularly, in the third direction DR3, the third adhesive layer OC2 may have a thickness greater than a sum of a thickness of the first adhesive layer OC1$a$ and a thickness of the second adhesive layer OC1$b$.

As illustrated in FIG. 11, although the adhesive layer AM-2 disposed between the window WM and the display part DM overall may include adhesive layers, embodiments of the inventive concept are not limited thereto. For example, only the adhesive layer AM-2 overlapping the folding area FA may include adhesive layers, and the adhesive layer AM-2 overlapping the first non-folding area NFA1 and the second non-folding area NFA2 may include a single adhesive layer containing only the first adhesive material.

According to an embodiment of the inventive concept, the adhesive layer attaching the display part and the window includes the folding adhesive area and the first and second adhesive areas spaced apart from each other with the folding adhesive area therebetween. Particularly, the folding adhesive area may be made of different kinds of materials, i.e., the first adhesive material and the second adhesive material having an elongation rate greater than the first adhesive material.

As the second adhesive material may have a density greater than that of the first adhesive material in the folding adhesive area, the adhesive layer may not be deformed even by the folding operation of the folding adhesive area.

Although embodiments of the invention have been described, it is understood that the invention should not be limited to these embodiments but various changes and modifications can be made by one ordinary skilled in the art within the spirit and scope of the invention as hereinafter claimed. Hence, the real protective scope of the invention shall be determined by the technical scope of the accompanying claims, including any equivalents.

What is claimed is:

1. A display device comprising:
   a display part comprising:
      a first non-folding area;
      a second non-folding area; and
      a folding area between the first non-folding area and the second non-folding area, the folding area being foldable with respect to a folding axis;
   a window disposed on the display part; and
   an adhesive layer disposed between the display part and the window, the adhesive layer comprising:
      a first adhesive material; and
      a second adhesive material having an elongation rate greater than an elongation rate of the first adhesive material, wherein
   the first adhesive material has a planar area greater than a planar area of the second adhesive material in each of the first non-folding area and the second non-folding area, and
   the second adhesive material has a planar area greater than a planar area of the first adhesive material in the folding area.

2. The display device of claim 1, wherein
   a portion of the first adhesive material overlaps the folding area and includes a shape of adhesive patterns arranged in a first direction and extending in a second direction perpendicular to the first direction, and
   each of the adhesive patterns comprises adhesive parts arranged with a distance between the adhesive parts in the second direction.

3. The display device of claim 2, wherein a portion of the second adhesive material overlaps the folding area and surrounds the adhesive patterns on a plane.

4. The display device of claim 2, wherein
   the folding area comprises a first area and a second area, which are divided with respect to the folding axis,
   the adhesive patterns comprise:
      first adhesive patterns that overlap the first area; and
      second adhesive patterns that overlap the second area, and
   a distance between first adhesive parts contained in the first adhesive patterns in the first direction among the adhesive parts increases in a direction toward the folding axis, and
   a distance between second adhesive parts contained in the second adhesive patterns in the first direction among the adhesive parts increases in the direction toward the folding axis.

5. The display device of claim 4, wherein
   the first area is between the first non-folding area and the second area, and
   the second area is between the second non-folding area and the first area.

6. The display device of claim 2, wherein
   the adhesive patterns comprise:
      a first adhesive pattern; and
      a second adhesive pattern disposed closer to the folding axis than the first adhesive pattern, and
   each of adhesive parts of the first adhesive pattern has an area greater than an area of each of adhesive parts of the second adhesive pattern on a plane.

7. The display device of claim 6, wherein
   the adhesive parts of the first adhesive pattern have areas that are same as each other, and
   the adhesive parts of the second adhesive pattern have areas that are same as each other on the plane.

8. The display device of claim 2, wherein at least a portion of the first adhesive material does not overlap the second adhesive material in the folding area.

9. The display device of claim 2, wherein the second adhesive material covers an entirety of the adhesive patterns.

10. The display device of claim 2, wherein
    the second adhesive material that overlaps the first non-folding area has a shape of first sub-adhesive patterns arranged in the first direction and extending in the second direction, and
    each of the first sub-adhesive patterns comprises first sub-adhesive parts arranged with a distance between first sub-adhesive parts in the second direction.

11. The display device of claim 10, wherein the first adhesive material that overlaps the first non-folding area surrounds the first sub-adhesive patterns on a plane.

12. The display device of claim 10, wherein a distance between the first sub-adhesive parts that overlap the first non-folding area decreases in a direction toward the folding area in the first direction.

13. The display device of claim 10, wherein
    the first sub-adhesive patterns comprise:
       a first pattern; and
       a second pattern disposed closer to the folding area than the first pattern, and
    each of the first sub-adhesive parts of the second pattern has an area greater than an area of each of the first sub-adhesive parts of the first pattern on a plane.

14. The display device of claim 10, wherein
    the second adhesive material that overlaps the second non-folding area has a shape of second sub-adhesive patterns arranged in the first direction and extending in the second direction,
    each of the second sub-adhesive patterns comprises second sub-adhesive parts arranged with a distance between the second sub-adhesive parts in the second direction, and
    the first adhesive material that overlaps the second non-folding area surrounds the second sub-adhesive patterns on a plane.

15. The display device of claim 10, wherein
    the first non-folding area comprises:
       a first sub-area; and
       a second sub-area that overlaps the first sub-adhesive patterns and is between
    the first sub-area and the folding area, and
    the first sub-area has an area greater than an area of the second sub-area on a plane.

16. A display device comprising:
a display part comprising:
   a first non-folding area;
   a second non-folding area; and
   a folding area between the first non-folding area and the second non-folding area, the folding area being foldable with respect to a folding axis;
a window disposed on the display part; and
an adhesive layer disposed between the display part and the window, the adhesive layer comprising:
   a first adhesive material; and
   a second adhesive material having an elongation rate greater than an elongation rate of the first adhesive material, wherein
a portion of the first adhesive material that overlaps the folding area has a shape of adhesive patterns arranged in a first direction and extending in a second direction perpendicular to the first direction, and
a distance between two neighboring adhesive patterns of the adhesive patterns increases in a direction toward the folding axis in the first direction.

17. The display device of claim 16, wherein
each of the adhesive patterns comprises adhesive parts arranged with a distance between the adhesive parts in the second direction,
the two adhesive patterns are a first adhesive pattern and a second adhesive disposed closer to the folding axis than the first adhesive pattern, and
each of adhesive parts of the first adhesive pattern has an area greater than an area of each of adhesive parts of the second adhesive pattern on a plane.

18. The display device of claim 16, wherein the second adhesive material does not overlap each of the first non-folding area and the second non-folding area.

19. A display device comprising:
a display part comprising:
   a first non-folding area;
   a second non-folding area; and
   a folding area between the first non-folding area and the second non-folding area, the folding area being foldable with respect to a folding axis;
a window disposed on the display part; and
an adhesive layer disposed between the display part and the window, the adhesive layer comprising:
   a first adhesive material; and
   a second adhesive material having an elongation rate greater than an elongation rate of the first adhesive material,
wherein the adhesive layer that overlaps the folding area comprises:
   a first adhesive layer disposed on the display part and corresponding to the first adhesive material;
   a second adhesive layer disposed on the first adhesive layer and corresponding to the first adhesive material; and
   a third adhesive layer disposed between the first adhesive layer and the second adhesive layer and corresponding to the second adhesive material.

20. The display device of claim 19, wherein the third adhesive layer has a thickness greater than a sum of a thickness of the first adhesive layer and a thickness of the second adhesive layer in a thickness direction of the display part.

* * * * *